United States Patent
Song et al.

(10) Patent No.: US 6,531,392 B2
(45) Date of Patent: Mar. 11, 2003

(54) METHOD OF FORMING A THIN FILM TRANSISTOR ARRAY PANEL USING PHOTOLITHOGRAPHY TECHNIQUES

(75) Inventors: Jun-Ho Song, Suwon (KR); Woon-Yong Park, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 5 days.

(21) Appl. No.: 09/418,476

(22) Filed: Oct. 15, 1999

(65) Prior Publication Data

US 2002/0130324 A1 Sep. 19, 2002

(30) Foreign Application Priority Data

Dec. 12, 1998 (KR) ............................................. 98-54583
Dec. 28, 1998 (KR) ............................................. 98-63913

(51) Int. Cl.[7] ........................................... H01L 21/443
(52) U.S. Cl. ....................... 438/648; 438/649; 438/650; 438/158
(58) Field of Search ................................ 438/158, 159, 438/160, 648, 649, 650, 651, 652, 151, 152, 153; 257/763, 762, 760, 761, 287

(56) References Cited

U.S. PATENT DOCUMENTS

| | | | | |
|---|---|---|---|---|
| 4,231,811 A | * | 11/1980 | Somekh | 148/1 |
| 5,380,680 A | * | 1/1995 | Choi | 437/195 |
| 5,517,341 A | * | 5/1996 | Kim et al. | 359/59 |
| 5,821,622 A | * | 10/1998 | Tsuji et al. | 257/763 |
| 5,847,780 A | * | 12/1998 | Kim et al. | 349/39 |
| 5,895,266 A | * | 4/1999 | Fu et al. | 438/648 |
| 5,986,729 A | * | 11/1999 | Yamanaka et al. | 349/79 |
| 6,127,998 A | * | 10/2000 | Ichikawa et al. | 345/100 |
| 6,133,977 A | * | 10/2000 | Lee et al. | 349/141 |
| 6,258,715 B1 | * | 7/2001 | Yu et al. | 438/648 |
| 6,287,899 B1 | * | 9/2001 | Park et al. | 438/149 |
| 6,335,276 B1 | * | 1/2002 | Park et al. | 438/648 |
| 6,403,980 B1 | * | 6/2002 | Park | 257/59 |

* cited by examiner

Primary Examiner—Tuan H. Nguyen
Assistant Examiner—Laura M Schillinger
(74) Attorney, Agent, or Firm—McGuireWoods LLP; Hae-Chan Park

(57) ABSTRACT

A gate wire is formed on an insulating substrate by a photolithography process using the first mask, and a gate insulating layer and a semiconductor layer are sequentially deposited. Then, an ohmic contact layer made of silicide or microcrystallized and doped amorphous silicon is formed on the semiconductor layer. Then, a triple pattern including a gate insulating layer, a semiconductor layer and an ohmic contact layer are patterned at the same time by a photolithography process using the second mask. At this time, a contact hole exposing the gate pad is formed. An ITO layer and a metal layer are deposited and patterned to form a data wire, a pixel electrode, and a redundant gate pad by a photolithography process using the third mask. The ohmic contact layer, which is not covered with the ITO layer and the metal layer, is removed. A passivation layer is deposited and patterned by a photolithography process using the fourth mask. Next, the metal layer of the pixel electrode, the redundant gate pad, and the data pad, which is not covered with the passivation layer, is removed. At this time, the semiconductor layer that is not covered with the passivation layer is removed to separate the semiconductor layer under the neighboring the data lines.

46 Claims, 40 Drawing Sheets

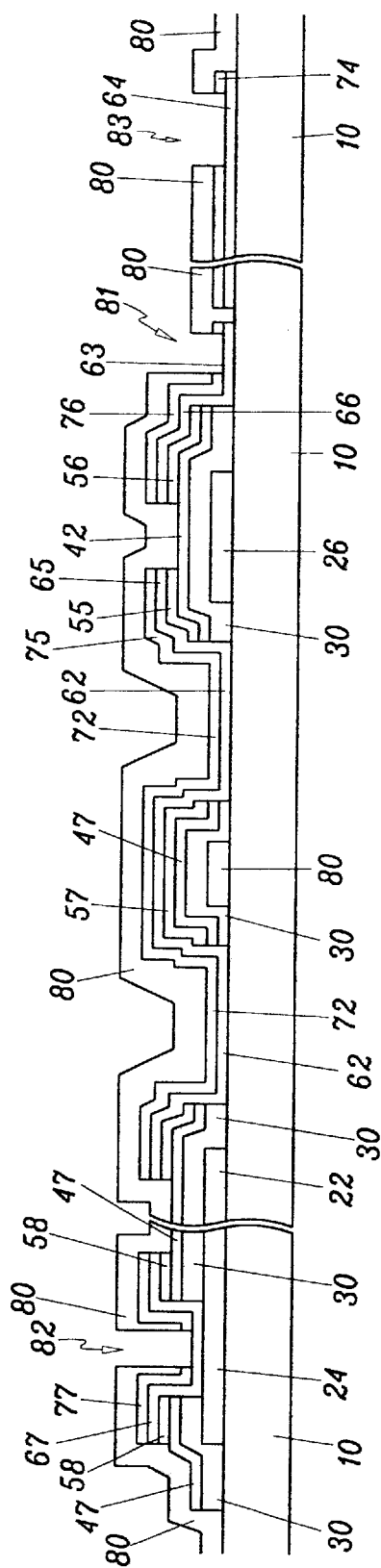
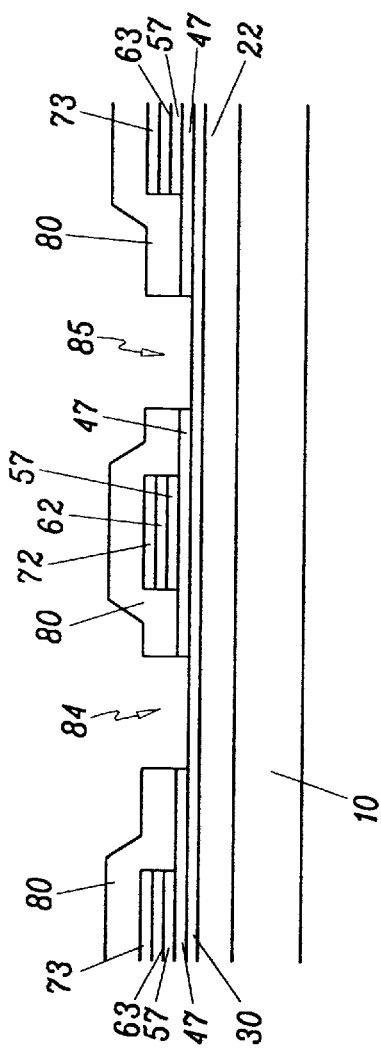
FIG. 4
FIG. 5

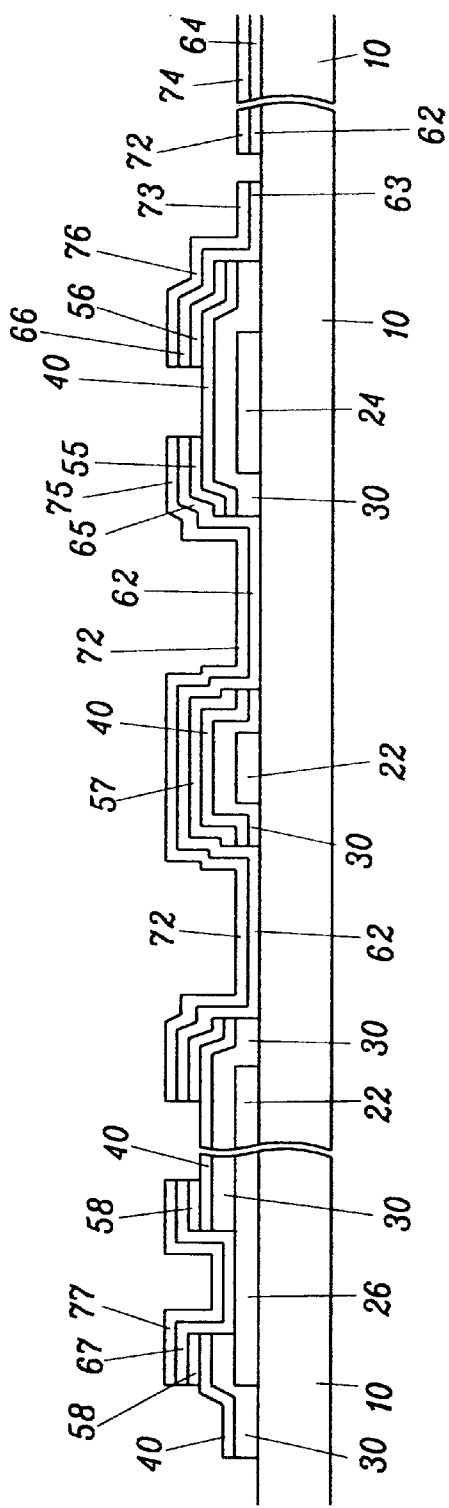

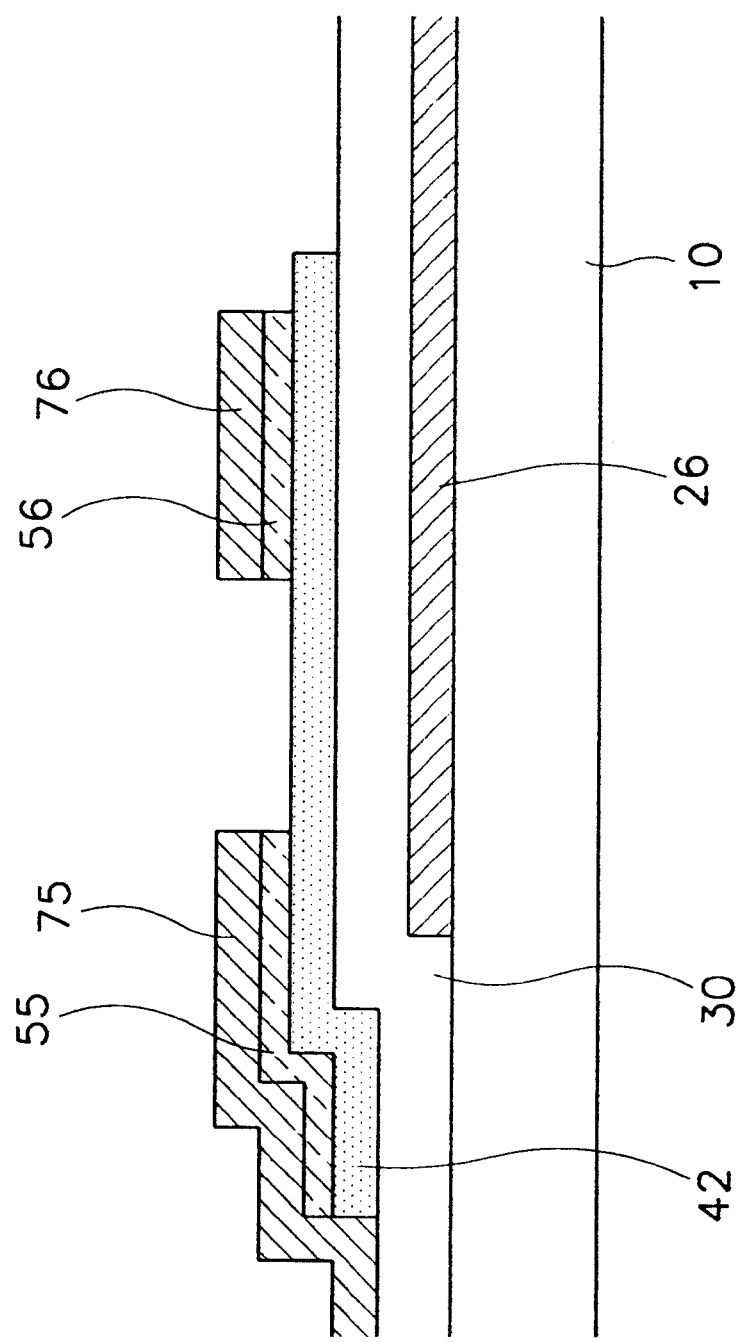

METHOD OF FORMING A THIN FILM TRANSISTOR ARRAY PANEL USING PHOTOLITHOGRAPHY TECHNIQUES

BACKGROUND OF THE INVENTION (a) Field of the Invention

The present invention relates to a thin film transistor (TFT) panel for a liquid crystal display (LCD) and methods for manufacturing the same.

(b) Description of the Related Art

An LCD is one of the most popular flat panel displays (FPDs). The LCD has two panels having two kinds of electrodes that generate electric fields and a liquid crystal layer interposed therebetween. The transmittance of incident light is controlled by the intensity of the electric field applied to the liquid crystal layer.

The field-generating electrodes may be formed at each of the panels or at one of the panels. One of the panels having at least one kind of the electrodes has switching elements such as thin film transistors.

In general, a TFT array panel of an LCD includes a plurality of pixel electrodes and TFTs controlling the signals supplied to the pixel electrodes. The TFT array panel is manufactured by photolithography using a plurality of photomasks. Five or six photolithography steps have been required to complete a TFT array panel. Since the photolithography process costs a lot and takes much time, it is desirable to reduce the number of the photolithography steps.

One conventional method of manufacturing a TFT array panel using four photolithography steps is disclosed in the "A TFT Manufactured by 4 Masks Process with New Photolithography" (Chang Wook Han et al., Proceedings of The 18th International Display Research Conference Asia Display 98, pp. 1109–1112, 1998. 9.28–10.1).

Meanwhile, a storage capacitor for sustaining the voltage applied to a pixel is generally provided in a TFT array panel. The storage capacitor includes a storage electrode and a portion of a pixel electrode as well as a passivation layer interposed therebetween. The storage electrode is made of the same layer as a gate wire, and the portion of the pixel electrode is formed on the passivation layer. The storage electrode is covered with a gate insulating layer, a semiconductor layer and a passivation layer, and most portion of the pixel electrode is formed directly on the substrate in Han et al. Thereby, the pixel electrode should step up the triple layers of the gate insulating layer, the semiconductor layer and the passivation layer, in order to overlap the storage electrode. It may cause a disconnection of the pixel electrode near the high step-up area.

Han et al. has a problem of forming a wide region, and it is hard to make the etch depth under the grid region to be uniform, even though a wide region is formed.

U.S. Pat. No. 4,231,811, U.S. Pat. No. 5,618,643, and U.S. Pat. No. 4,415,262 and Japanese patent publication No. 61-181130 and etc. which disclose similar methods as Han et al. have the same problem.

SUMMARY OF THE INVENTION

It is therefore an object of the present invention to suggest new manufacturing method of thin film transistor panels.

It is another object of the present invention to simplify the manufacturing method of a TFT array panel for an LCD, thereby reducing the manufacturing costs and increasing yield.

It is another object of the present invention to prevent current leakage problems of a TFT array panel for an LCD.

These and other objects are provided, according to the present invention, by patterning a gate insulating layer pattern having a contact hole that exposes a gate pad, along with a semiconductor layer pattern and an ohmic contact layer pattern, by etching an ohmic contact layer that is not covered by the conductor pattern having dual-layered structure, a pixel electrode and a data wire, and formed thereon, and by etching the upper conductor layer of the conductor pattern that is not covered by a passivation layer.

In a manufacturing method according to the present invention, a gate wire on an insulating substrate is formed by using a first photomask. A triple layer including a gate insulating layer pattern, a semiconductor layer pattern and an ohmic contact layer pattern on the same that covers the gate wire is formed by by using a second photomask. A conductor pattern having a double-layered structure of a lower conductor layer and an upper conductor layer is formed by using a third photomask. And the ohmic contact layer pattern that is not covered with the conductor pattern is etched out. A passivation layer is formed by using a fourth photomask and the upper conductor layer of the conductor pattern which is not covered with the passivation layer is etched.

Here, the ohmic contact layer pattern may be formed of a silicide, microcrystallized silicon or doped amorphous silicon.

The gate insulating layer pattern, the semiconductor layer pattern and the ohmic contact layer pattern may have the same shapes.

In one method, a gate insulating layer and a semiconductor layer are sequentially deposited. A silicifiable metal layer is laid on the semiconductor layer to form a silicide ohmic contact layer and is removed. Then, the ohmic contact layer, the semiconductor layer and the gate insulating layer are patterned using a third mask to form an ohmic contact layer pattern, a semiconductor layer pattern and a gate insulating layer pattern.

In another method, a gate insulating layer and a semiconductor layer are sequentially deposited and patterned using a third mask to form a semiconductor layer pattern and a gate insulating layer pattern. The silicifiable metal layer is deposited on the semiconductor layer pattern to form an ohmic contact layer pattern of silicide, and is removed. Here, the gate wire may be made of tow layers. At this time, the lower layer may be aluminum or aluminum alloy and the upper payer may be molybdenum or molybdenum alloy. The metal layer may be chromium. Also, the lower layer may be chromium, the upper payer aluminum or aluminum alloy, and the metal layer molybdenum or molybdenum alloy.

In another method, a gate insulating layer and a semiconductor layer are sequentially deposited, and a doped amorphous silicon on the semiconductor layer is deposited and microcrystalized to form an ohmic contact layer. Then, the ohmic contact layer, the semiconductor layer and the gate insulating layer are patterned by using the third mask to form the ohmic contact layer pattern, the semiconductor layer pattern and the gate insulating layer pattern.

Furthermore, the gate insulating layer pattern, the semiconductor layer pattern and the ohmic contact layer pattern may have different shapes in the step of forming the triple layers.

In this method, a gate insulating layer, a semiconductor layer and an ohmic contact layer are sequentially deposited. Then, a photoresist layer on the ohmic contact layer is coated and developed to form a photoresist layer pattern. The photoresist pattern has a first portion, a second portion thicker than the first portion and a third portion thicker than the second portion at least. Next, the ohmic contact layer, the semiconductor layer and the gate insulating layer under the first portion are patterned to form the gate insulating layer pattern, and the ohmic contact layer and the semiconductor layer under the second portion are patterned to form the ohmic contact layer pattern and the semiconductor layer pattern.

Here, the photoresist layer is exposed and developed by using the second photomask including at least a first region, a second region and a third region having different transmittance respectively and corresponding to the first portion, the second portion and the third portion respectively. It is preferable that the photoresist layer is a positive photoresist, and the transmittance of the second region is smaller than that of the first region and is larger than that of the third region.

The second photomask includes a mask substrate and at least a mask layer formed on the mask substrate. The difference of the transmittance between the second region and the third region is controlled by forming mask layers having different transmittance levels, or by adjusting the thickness of the mask layer. Furthermore, the transmittance difference of the second photomask may be controlled by forming a slit or a lattice pattern that is smaller than the resolution of the exposure equipment used in exposure step. The photomask may include at least two pieces of substrates having at least two.

It is desirable that the lower conductor layer is made of indium tin oxide.

Here, the gate wire includes a gate line, a gate electrode that is a branch of the gate line and a gate pad connected to the gate line and transmitting a scanning signal from an external circuit to the gate line. The conductor pattern includes a data wire and a pixel electrode, and the triple layers and the passivation layer has a contact hole and a first opening respectively to connect the gate pad to the external circuit electrically.

Also, the conductor pattern further comprises a redundant gate pad that is connected to the gate pad through the contact hole, and the lower conductor layer of the redundant gate pad is exposed through the first opening.

Here, the ohmic contact layer pattern has two divided portions, and the data wire includes a data line crossing the gate line, a source electrode connected to the data line and formed on the one portion of the ohmic contact layer pattern, a drain electrode formed on the other portion of the ohmic contact layer pattern opposite of the source electrode with respect to the gate electrode and separated from the source electrode, and a data pad connected to the data line and transmitting an image signal from an external circuit to the data line. The pixel electrode is connected to the drain electrode, and the passivation layer has a second opening exposing the lower conductor layer pattern of the pixel electrode and a third opening exposing the lower conductor layer pattern of the data pad. The passivation layer may have a fourth opening exposing the part of the gate insulating layer pattern on the gate line between the neighboring data lines, and it is preferable that the semiconductor layer pattern that is not covered with the passivation layer is removed.

In another manufacturing method according the present invention, a gate wire including a gate line, a gate electrode and gate pad on an insulating substrate is formed by photolithography using a first photomask. Next, a gate insulating layer, a semiconductor layer and an ohmic contact layer are sequentially deposited on the gate wire, and the semiconductor layer and the ohmic contact layer pattern along with the gate insulating layer are patterned by photolithography using a second photomask to form a gate insulating layer pattern having a contact hole exposing the gate pad, a semiconductor layer pattern and an ohmic contact layer pattern. A conductor layer having a double-layered structure made of a lower conductor layer and an upper conductor layer is formed, and patterned by photolithography using a third photomask to form a data wire including a data line, a source electrode, a drain electrode and a data pad, a pixel electrode connected to the drain electrode, and a redundant gate pad connected to the gate pad through the contact hole. Next, the ohmic contact layer pattern exposed is etched, and a passivation layer is deposited on the substrate. Then, the passivation layer is patterned by photolithography using a fourth photomask to form a passivation layer pattern having a first opening to a third opening exposing the redundant gate pad, the data pad and the pixel electrode, respectively, and the upper conductor layer that is not covered with the passivation layer is etched.

Here, it is preferable that the third opening is larger than the pixel electrode, and the ohmic contact layer is made of silicide, microcrystalized silicon or amorphous silicon.

Also, the gate insulating layer pattern, the semiconductor layer pattern and the ohmic contact layer pattern may have shapes different from each other in the step of forming the triple layers.

In another manufacturing method according to the present invention, a gate wire including a gate line, a gate electrode and gate pad on an insulating substrate is formed, and a gate insulating layer pattern covering the gate wire is formed. A semiconductor layer pattern on the gate insulating layer pattern is formed, an ohmic contact layer pattern on the semiconductor layer pattern is formed, and a data wire including a data line, a source electrode, a drain electrode and a data pad is formed. A passivation layer is formed, and a pixel electrode connected to the drain electrode is formed. At this time, the gate insulating layer pattern is patterned by using one photoresist pattern as etch mask having the different thickness according to the portion along with the semiconductor layer pattern and the ohmic contact layer pattern.

Here, the photoresist pattern has a first portion, a second portion thicker than the first portion and a third portion thicker than the second portion, and the photoresist pattern is formed by photolithography using a photomask having a first region to a third region respectively corresponding to the first portion to the third portion and having different light transmittance.

It is preferable that the photoresist pattern is a positive photoresist layer, and the transmittance of the third region is smaller than that of the first region, and is larger than that of the second region.

The photomask includes a mask substrate and at least a mask layer that is formed on the mask substrate, and the difference of the transmittance between the second region and the third region is controlled by forming the mask layers having the different transmittance or by adjusting the thickness of the mask layer.

Also, the difference of the transmittance of the photomask is controlled by forming a slit or a lattice pattern that are smaller than the resolution of the light used in exposure step.

In another manufacturing method according to the present invention, a gate wire including a gate line, a gate electrode and gate pad, and a common wire including a common signal line and a common electrode on an insulating substrate are formed. A gate insulating layer, a semiconductor layer and an ohmic contact layer on the gate wire and the common wire are sequentially formed, and a photoresist layer on the ohmic contact layer is coated. Then, the photoresist layer is exposed and developed to form a photoresist pattern having different thickness according to the portion, and the semiconductor layer and the ohmic contact layer are patterned by using the photoresist pattern to form a semiconductor layer pattern, a first ohmic contact layer pattern, and a contact hole exposing the gate pad. Next, a conductor layer is deposited and patterned along with the first ohmic contact layer pattern to form a data wire including a data line, a source electrode, a drain electrode, a data pad and a pixel electrode, and the underlying second ohmic contact layer pattern. And a passivation layer is deposited and patterned to expose the gate pad and the data pad.

In a thin film transistor array panel for a liquid crystal display according to the present invention, a gate wire formed on the insulating substrate, including a gate line, a gate electrode connected to the gate line and a gate pad connected to the end of the gate line is formed. A gate insulating layer covering the gate wire and having a contact hole exposing the gate pad is formed. A semiconductor layer is formed on the gate insulating layer, and a data wire having a double-layered structure made of lower conductor layer and upper conductor layer, that includes a data line crossing across the gate line, a source electrode connected to the data line, a drain electrode opposite to the source electrode with respect to the gate electrode and separated from the source electrode, and a data pad connected to the data line and mainly made of the lower conductor layer. A redundant gate pad covering the gate pad through the contact hole and mainly made of the lower conductor layer is formed. And a pixel electrode connected to the drain electrode and mainly made of the lower conductor layer is formed. A passivation layer formed on the data wire, the semiconductor layer, the gate insulating layer and the substrate has a first opening through a fourth opening that exposes respectively the pixel electrode, the gate insulating layer on the gate line between the neighboring data lines, the redundant gate pad and the data pad. Here, only the upper conductor layer is interposed between the passivation layer and the lower conductor layer.

It is preferable that the boundary of the semiconductor layer concurs with the boundary of the portion where the gate insulating layer overlaps the passivation layer, and semiconductor layer patterns under the neighboring data line is separated.

It is preferable that the lower conductor layer is made of indium tin oxide or transparent conductive materials and an ohmic contact layer pattern made of suicide or microcrystalized doped amorphous silicon to reduce the contact resistivity between the semiconductor layer and the upper conductor layer is formed between the semiconductor layer and the upper conductor layer. The boundary of the ohmic contact layer concurs with the boundary of the portion where the semiconductor layer overlaps the data wire.

BRIEF DESCRIPTION OF THE DRAWINGS

FIGS. 4 and 5 are cross-sectional views respectively taken along the line IV–IV' and V–V' of the FIG. 1.

FIGS. 8B and 8C are respectively the cross-sectional views taken along the line VIIIB–VIIIB' and VIIIC–VIIIC' of the FIG. 8A.

FIGS. 25B and 25C are respectively the cross-sectional views taken along the line XXVB–XXVB' and XXVC–XXVC' of the FIG. 25A.

DETAILED DESCRIPTION OF THE PREFERRED EMBODIMENTS

Figure 1:
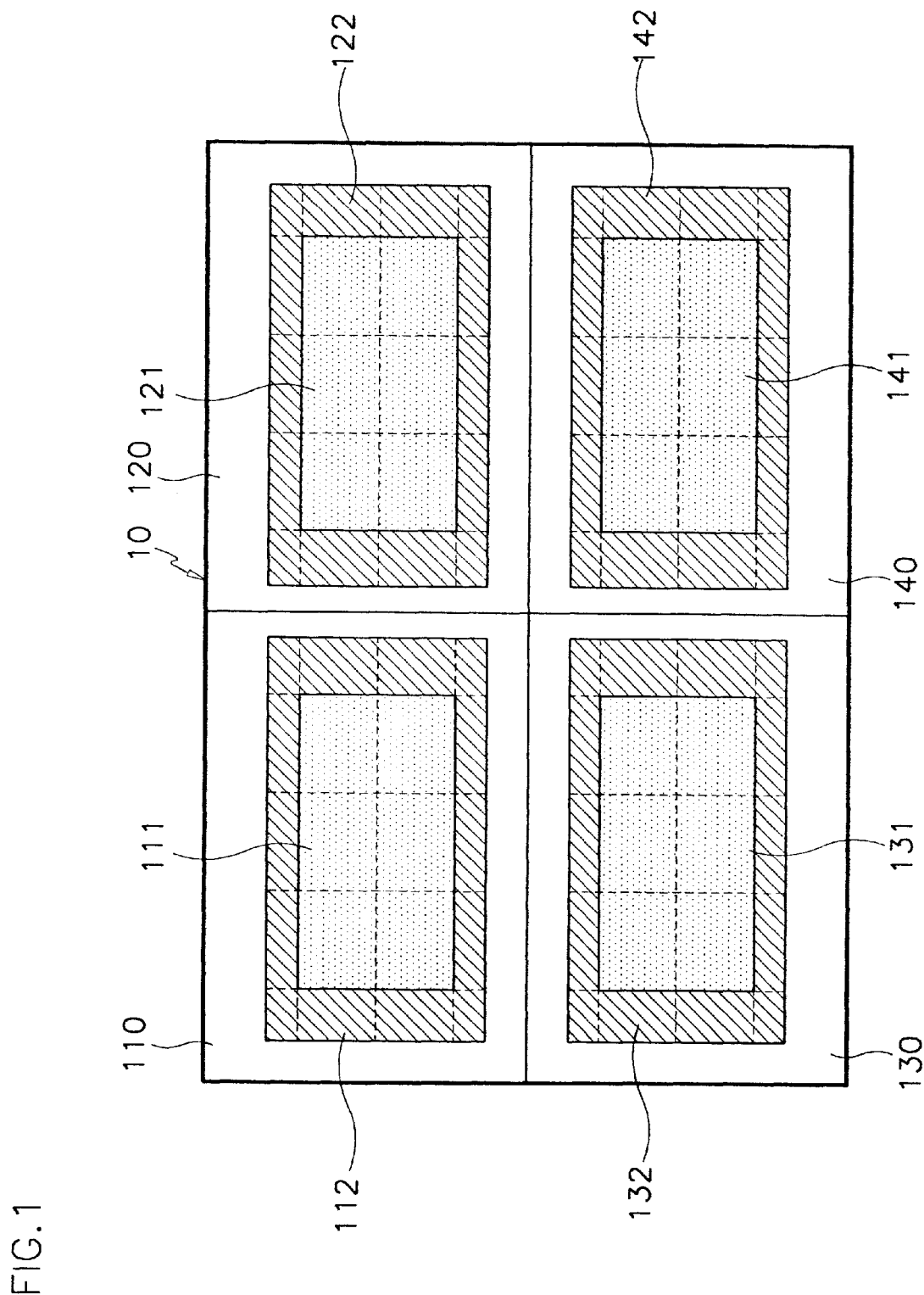
FIG. 1 is a plan view of a substrate partitioned to manufacture a TFT array panel for an LCD according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

In the present invention, a gate insulating layer pattern having contact holes exposing gate pads is formed by etching along with a semiconductor layer pattern and an ohmic contact layer pattern. A double-layered conductor pattern having a data wire and a pixel electrode is formed, and then portions of the ohmic contact layer pattern, which is not covered with the double-layered conductor pattern, is removed. A passivation layer is formed, and portions of an upper layer of the double-layered conductor pattern, which is not covered with a passivation layer, is etched.

Now, a structure of a TFT array panel according to an embodiment of the present invention Will be described with reference to the FIGS. 1 to 5.

As shown in FIG. 1, pluralities of panel areas are formed on an insulating plate 10. For example, as shown in FIG. 1, four panel areas 110, 120, 130 and 140 are formed on a glass plate 10. When the panels are TFT array panels, the panel areas 110, 120, 130 and 140 include display areas 111, 121, 131 and 141 having a plurality of pixels and peripheral areas 112, 122, 132 and 142, respectively. TFTs, wires and pixel electrodes are repeatedly arranged in matrix in the display areas 111, 121, 131 and 141, and pads to be connected to external circuits and electrostatic discharge protection circuits are provided in the peripheral areas 112, 122, 132 and 142.

In general, the elements in the panel areas 110, 120, 130 and 140 are formed by photolithography using a stepper, an exposure equipment. When using a stepper, the display areas 111, 121, 131 and 141 and the peripheral areas 112, 122, 132 and 142 are divided into several sections, and a PR layer coated on thin films on the plate 10 is exposed to light section by section through one or more masks. Then, the PR layer is developed, and the thin films under the PR layer are etched to form thin film patterns. A complete LCD panel is obtained by repeating the above described patterning step.

Figure 2:
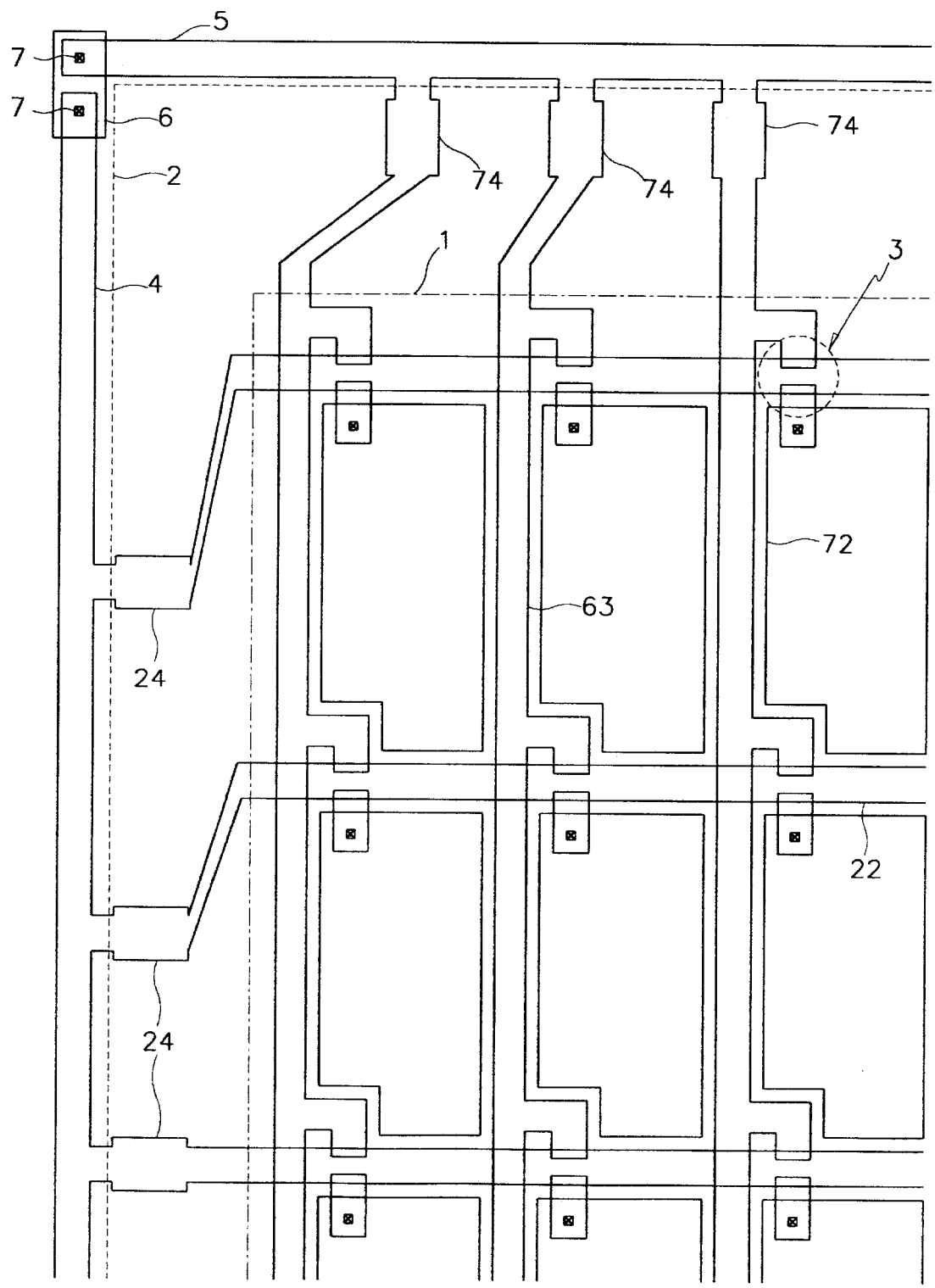
FIG. 2 is a layout view of a TFT array panel for an LCD according to an embodiment of the present invention.

FIG. 2 is a layout view of a TFT array panel area shown in FIG. 1 according to an embodiment of the present invention.

As shown in FIG. 2, a plurality of TFTs, a plurality of pixel electrodes electrically connected thereto and a plurality of wires including gate lines 22 and data lines 62 are formed in the display area surrounded by an imaginary line 1. Gate pads 24 and data pads 64 respectively connected to the gate lines 22 and the data lines 62, and a gate shorting bar 4 and a data shorting bar 5 are formed in the peripheral area. The gate shorting bar 4 and the data shorting bar 5 connect the whole gate lines 22 and the whole data lines 22, respectively, and are electrically connected to each other through a connector 6 to make them in the same potential, thereby protecting the device elements from electrostatic discharge failure. The shorting bars 4 and 5 will be removed by cutting the panel along the cutting line 2. A reference numeral 7 represents contact holes formed in insulating layers (not shown) interposed between the connector 7 and the shorting bars 4 and 5, and the connector 6 connects the shorting bars 4 and 5 through the contact holes 7.

Figure 3:
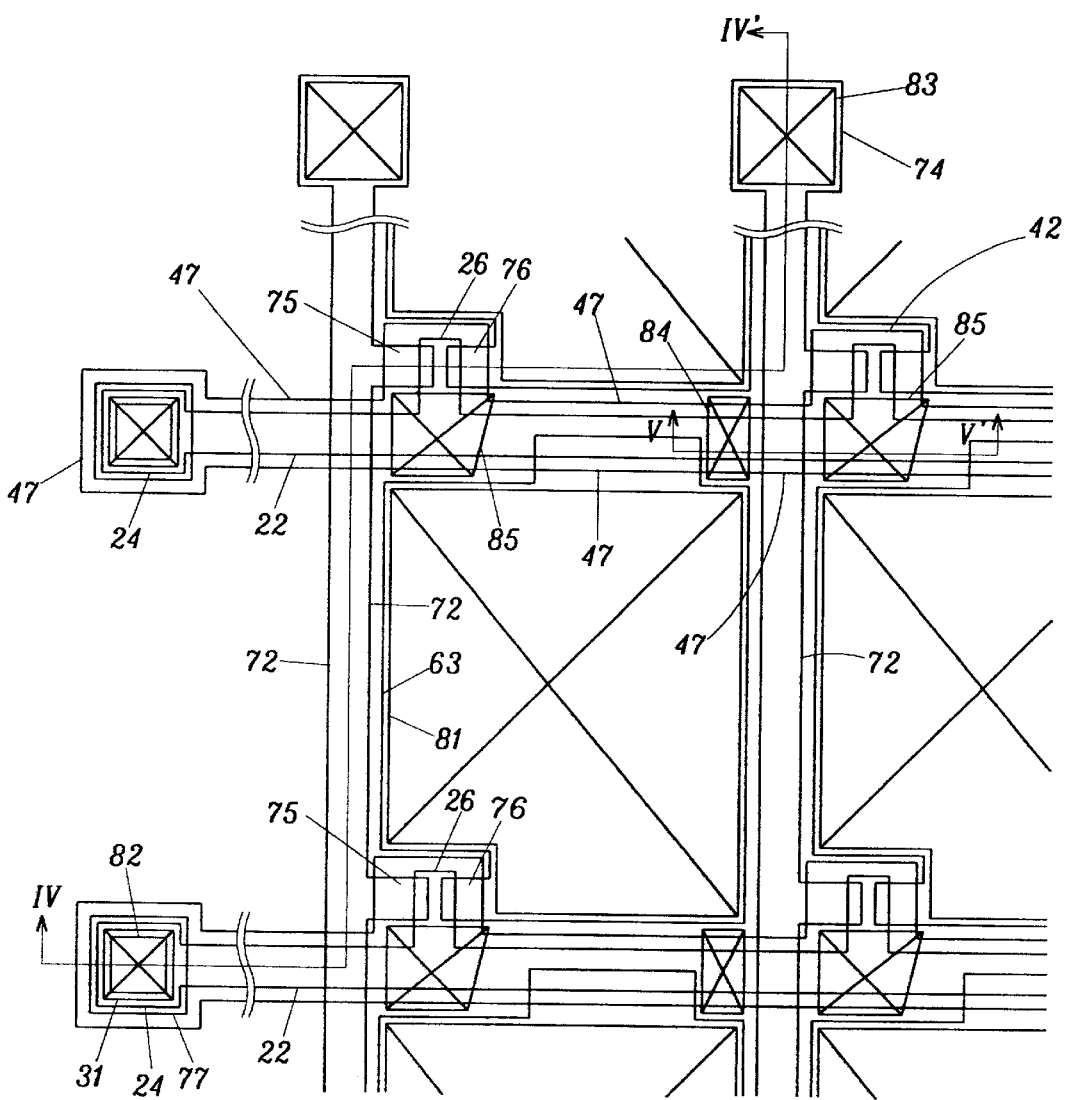
FIG. 3 is a layout view of a TFT array panel for an LCD according to the first embodiment of the present invention, and an enlarged view of a portion chiefly including a pixel and pads of the FIG. 2.

FIGS. 3 to 5 are an enlarged view of a TFT array panel shown in FIG. 2 according to an embodiment of the present invention, FIG. 3 is a layout view, and FIGS. 4 and 5 are cross-sectional views taken along the lines IV–IV' and V–V' in FIG. 3.

A gate wire of metal or conductive material such as aluminum (Al) and aluminum alloy, molybdenum (Mo) or molybdenum-tungsten (MoW) alloy, chromium (Cr) and tantalum is formed on an insulating substrate 10. The gate wire includes a plurality of gate lines (scanning signal lines) 22 extending in the horizontal direction, a plurality of gate pads 24 that are connected to one ends of the respective gate lines 22 and transmit scanning signals from an external circuit to the gate lines 22, and a plurality of gate electrodes 26 of TFTs that are branches of the gate lines 22.

The gate wire 22, 24 and 26 may have a multiple-layered structure as well as a single-layered structure. When the gate wire 22, 24 and 26 has a single-layered structure, its thickness is about 1,000~3,000 Å. When forming the gate wire 22, 24 and 26 of a dual-layered structure, it is preferable that a lower layer is made of a material having low resistivity such as aluminum (Al) and aluminum-neodymium (Al—Nd) with a thickness of 1,000~2,000 Å and an upper layer is made of a material, which has a good contact with other materials, such as molybdenum-tungsten alloy (MoW) with a thickness of 500~1,000 Å. A material such as Cr, Mo or Mo alloy may be available for the single-layered structure, and for the double-layered structure along with Al and Al alloy.

A gate insulating layer pattern 30 of silicon-nitride (SiNx) with the thickness of 2,500~3,000 Å is formed on the gate wire 22, 24 and 26 and covers the same.

A semiconductor layer pattern 42 and 47 made of semiconductor such as hydrogenated amorphous silicon with a thickness of 1,000~2,000 Å is formed on the gate insulating layer pattern 30. The semiconductor layer pattern 42 and 47 is made of a plurality of the first portions 42, which serve channel layers of TFTs and are located near the gate electrodes 26, and a plurality of the second portions 47, which are isolated and located over the gate lines 22. The second portions 47 extend to the gate pads 24.

An ohmic contact layer pattern 55, 56, 57 and 58 with a thickness of several Å to several tens Å is formed on the semiconductor layer pattern 42 and 47. The ohmic contact layer pattern 55, 56, 57 and 58 has a single-layered structure of doped microcrystallized amorphous silicon, or silicide of chromium or molybdenum or a double-layered structure of doped microcrystallized amorphous silicon and silicide of chromium or molybdenum formed thereon. The ohmic contact layer pattern has separate four portions. Two portions 55 and 56 are opposite to each other with respect to the gate electrodes 24, portions 58 are located along the edges of the gate pads 24, and the remaining portions 57 are located at the overlap of the semiconductor layer pattern 47 and pixel electrodes or data lines, which will be described later.

The gate insulating layer pattern 30, the semiconductor layer pattern 47 and the ohmic contact layer pattern 58 have contact holes 31 exposing the gate pads 24.

A conductor pattern having a double-layered structure including a lower conductor layer 62, 63, 64, 65, 66 and 67 and an upper conductor layer 72, 74, 75, 76 and 77 is formed on the ohmic contact layer pattern 55, 56, 57 and 58 and the substrate 10. The lower conductor layer 62, 63, 64, 65, 66 and 67 with a thickness of 300 Å to 1,000 Å is made of transparent material such ITO (indium tin oxide) or IZOC (indium zinc oxide), and the upper conductor layer 72, 74, 75, 76 and 77 with a thickness of 1,000 Å to 3,500 Å is made of conductive material such as Mo or MoW, Cr, Al or Al alloy and Ta.

The data wire has a plurality of data lines 62 and 72 extending in the vertical direction, a plurality of data pads 64 and 74 which are connected to one end of the data lines 62 and transmit image signals from an external circuit to the data lines 62 and 72, and a plurality of source electrodes 65 and 75 of TFTs, which are branches of the data lines 62 on the portion 55 of the ohmic contact layer pattern. The data wire also has a plurality of drain electrodes 66 and 76 formed on the portion 56 of the ohmic contact layer pattern. A plurality of pixel electrodes 63 are formed in pixel regions surrounded by the gate lines 22 and the data lines 62 and 72. The main parts of the data pads 64 and 74 and the pixel electrodes 63 include only the lower conductor layer 64 and 63, respectively, and their edge parts have a double-layered structure. However, the pixel electrodes 63 may include only the lower conductor layer 63. The pixel electrodes 63 overlap the gate line 22 via the gate insulating layer 30 to form a storage capacitor. A plurality of redundant gate pads 67 and 77 are formed on the gate pads 24 and connected to the gate pads 24. The redundant gate pads 67 and 77 protect the gate pads 24 and complement the electric contacts between an external circuit and the gate pad 24. The most part of the redundant gate pad 67 and 77 includes only the lower conductor layer 67 except for edges.

In this embodiment, transparent material is taken as an example of the lower conductor layer, but an opaque-conductive material may be used in a reflective type LCD.

The ohmic contact layer pattern 55, 56, 57 and 58 is located at the portion where the semiconductor layer pattern 42 and 47 and the lower conductor layer 62, 63, 64, 65, 66 and 67 overlap each other, interposed therebetween to play a role to reduce the contact resistance between the semiconductor layer pattern 42 and 47 and the lower conductor layer 62, 63, 64, 65, 66 and 67.

A passivation layer 80 made of insulating material such as silicon nitride with a thickness of 1,500 Å to 4,000 Å covers the whole surface. The passivation layer 80 along with the upper conductor layer 72, 74, 75, 76 and 77 has openings 81, 82 and 83 exposing the lower conductor layer 63, 67 and 64 of the pixels electrodes 63, the redundant gate pads 67 and the data pads 64, and openings 84 and 85 exposing the gate insulating layer pattern 30 over the gate line 22. The openings 84 and 85 divides the semiconductor layer pattern into two portions 42 and 47 to prevent parasitic transistor having a gate of the gate line 22, a source of the data line 62 and 72, and a drain of the pixel electrode 63. The parasitic transistor may cause problems in this previous gate type that the pixel electrode 63 overlaps the previous gate line 22 as shown in FIGS. 1 and 3. The separation of the semiconductor layer pattern is not only necessary for a previous gate type LCD but for other types of LCDs. That is to say, the semiconductor layer may form a channel when gate voltage are applied. If two neighboring data lines are connected to each other through the semiconductor layer, the image signals applied to the two data lines may be interfered. Accordingly, it is necessary to separate the portions of the semiconductor layer between the two neighboring data lines. In the meantime, if the opening 81 is larger than the pixel electrode 63, the pixel electrode 63 is only formed of the lower conductor layer as described above.

Now, a manufacturing method for a thin film transistor array panel according to the first embodiment of the present invention will be described with reference to FIGS. 6A to 8C as well as to FIGS. 3 to 5.

Figure 6A:
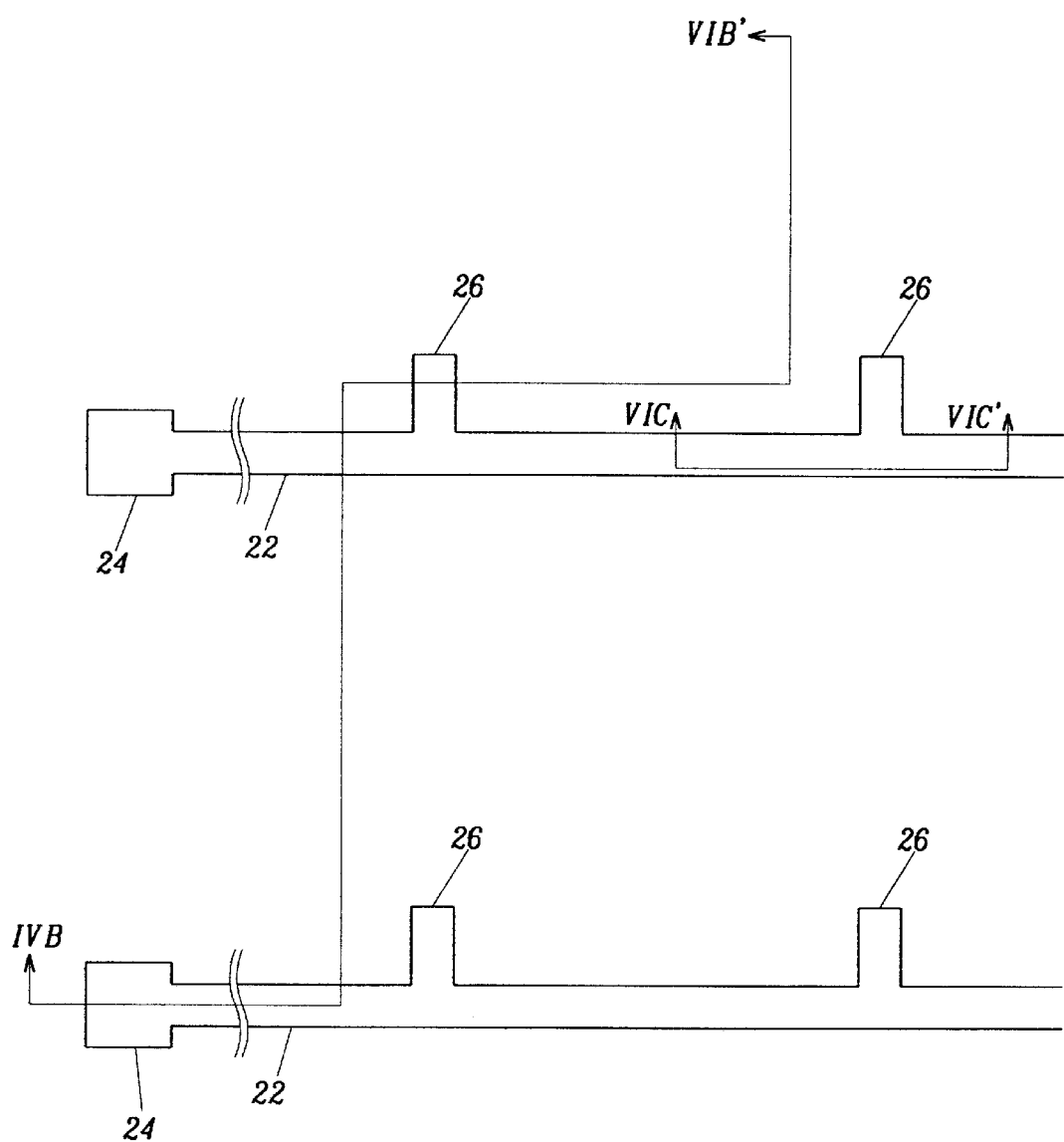
FIG. 6A is a layout view of a TFT array panel in the first manufacturing step according to the first embodiment of the present invention.
Figure 6B:
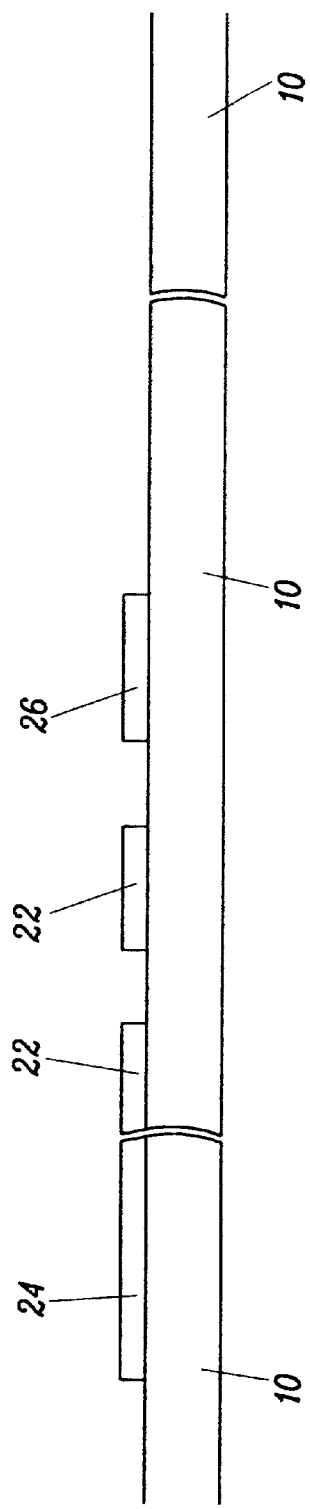
FIGS. 6B and 6C are respectively the cross-sectional views taken along the line VIB–VIB' and VIC–VIC' of the FIG. 6A.
Figure 6C:
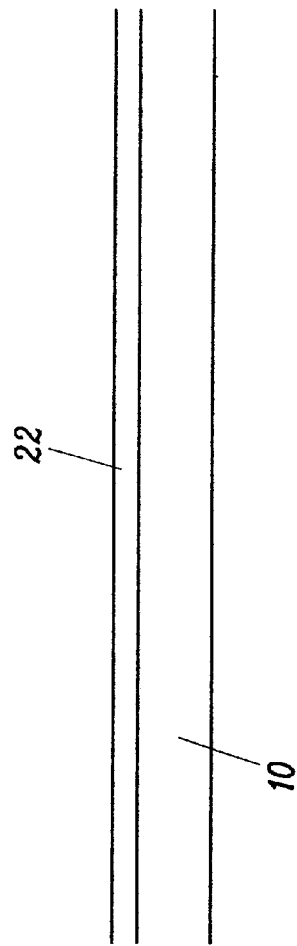
Figure 7A:
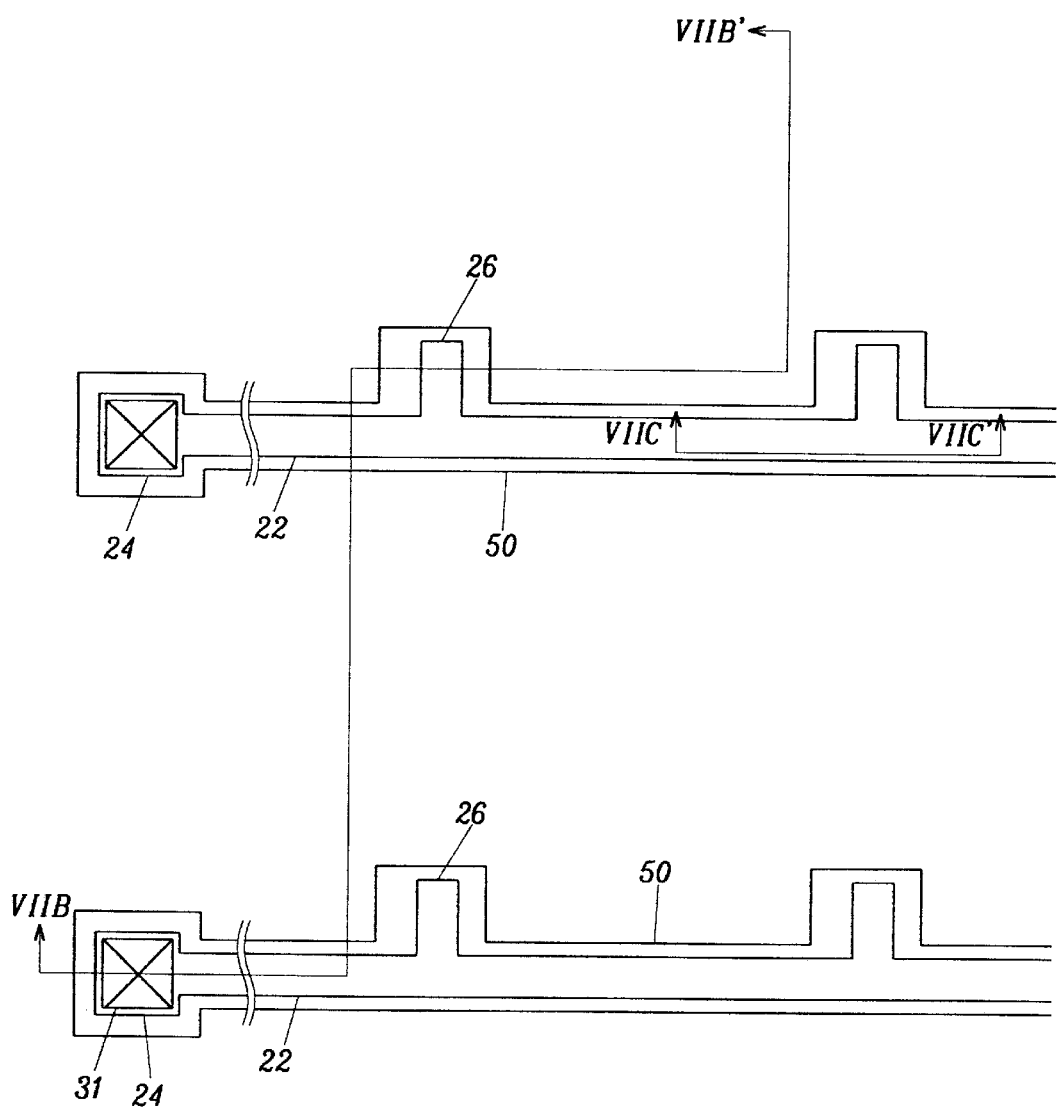
FIG. 7A is a layout view of a TFT array panel in a manufacturing step following the FIGS. 6A to 6C.
Figure 7B:
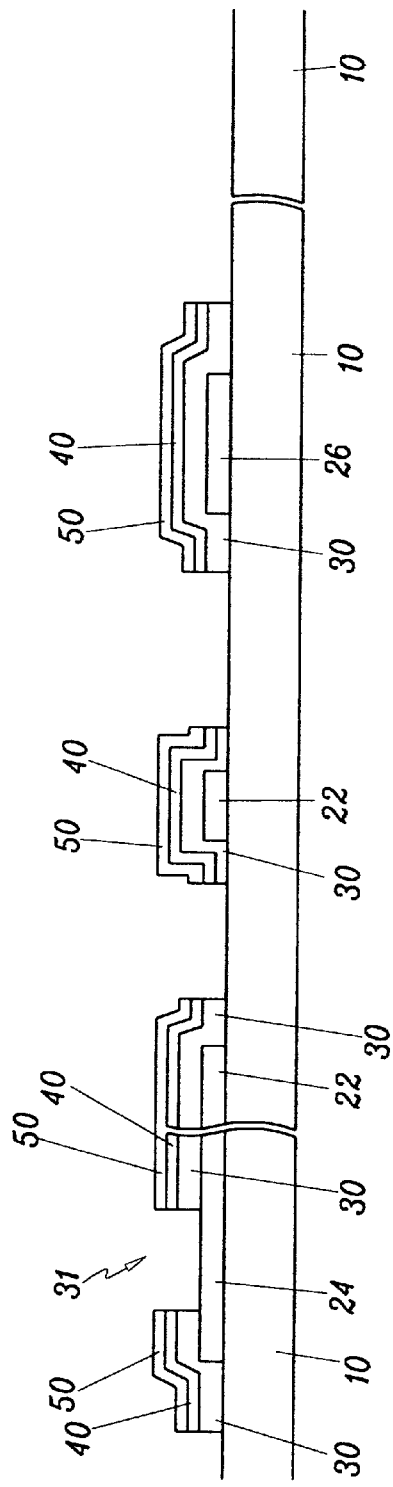
FIGS. 7B and 7C are respectively the cross-sectional views taken along the line VIIB–VIIB' and VIIC–VIIC' of the FIG. 7A.
Figure 7C:
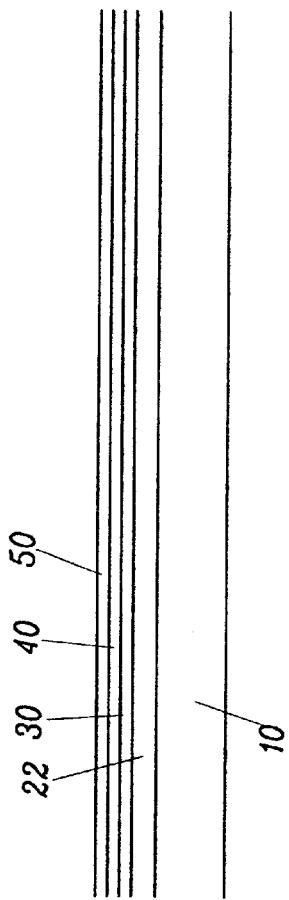
Figure 8A:
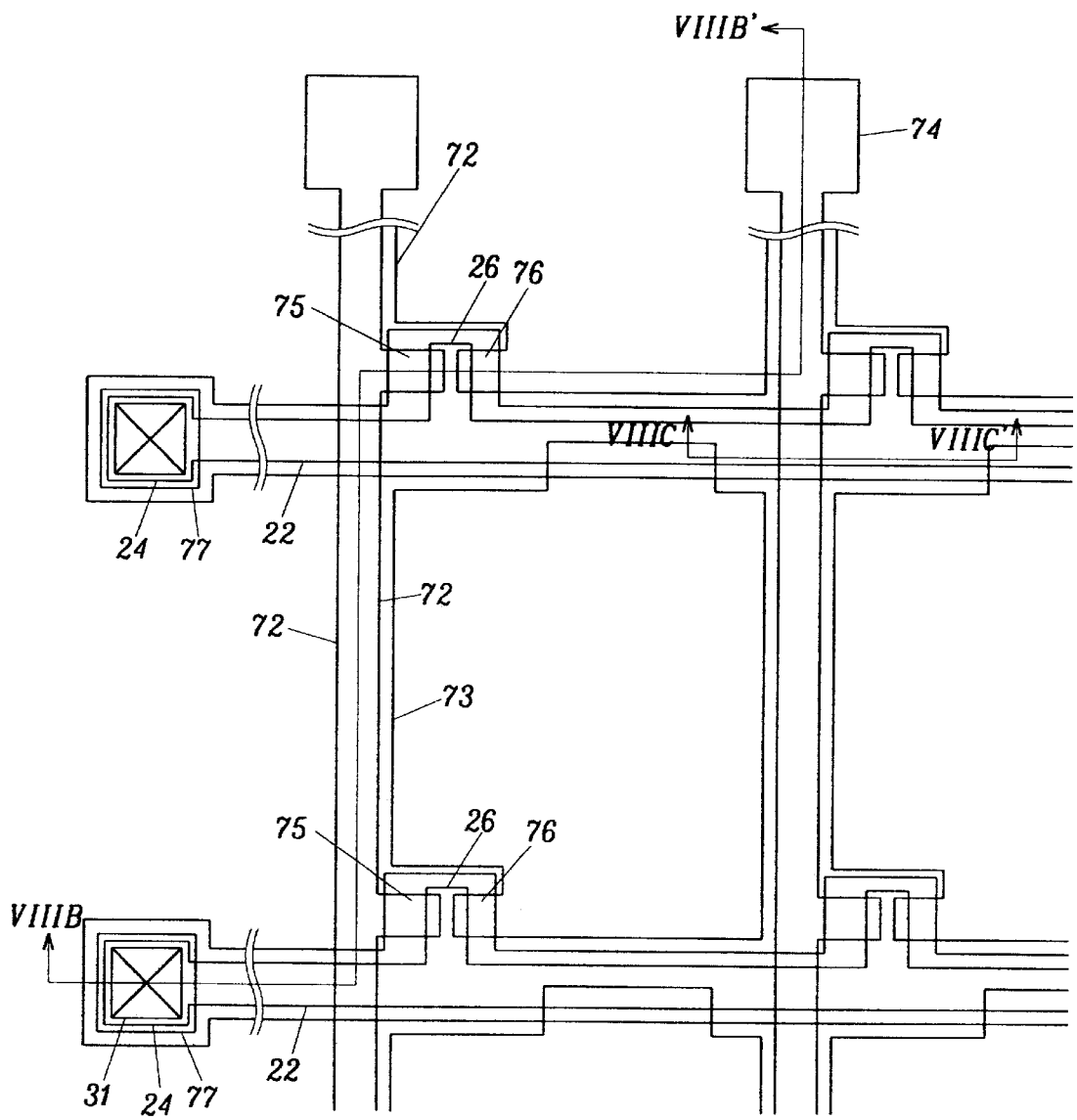
FIG. 8A is a layout view of a TFT array panel in a manufacturing step following the FIGS. 7A to 7C.

FIG. 6A is a layout view of a TFT array panel in the first manufacturing step according to the first embodiment of the present invention, FIGS. 6B and 6C are the cross-sectional views taken along the lines VIB–VIB' and VIC–VIC' of FIG. 6A, respectively. FIG. 7A is a layout view of a TFT array panel in a manufacturing step following FIGS. 6A to 6C. FIGS. 7B and 7C are the cross-sectional views taken along the lines VIIB–VIIB' and VIIC–VIIC' of FIG. 7A, respectively. FIG. 8A is a layout view of a TFT array panel in a manufacturing step following FIGS. 7A to 7C, and FIGS. 8B and 8C are the cross-sectional views taken along the lines VIIIB–VIIIB' and VIIIC–VIIIC' of FIG. 8A, respectively.

First, as shown in FIGS. 6A to 6C, a transverse gate wire including a plurality of gate lines 22, a plurality of gate pads 24 and a plurality of gate electrodes 26 are formed by a first photolithography process. As described above, the gate wire 22, 24 and 26 may have a double-layered structure of an aluminum-neodymium (Al—Nd) layer and a molybdenum-tungsten alloy (MoW) layer and be formed by using dry etch. Instead, the gate wire 22, 24, and 26 may include a chromium (Cr) layer and an aluminum-neodymium (Al—Nd) layer and be formed by using wet etch.

Next, as shown in FIGS. 7A and 7C, a gate insulating layer 30, a semiconductor layer 40 are sequentially deposited by such a method as chemical vapor deposition (CVD). Then, a metal layer (not shown) made of refractory metal, which can silicified, such as chromium and molybdenum is deposited on the semiconductor layer 40 to form a metal silicide layer 50 as an ohmic contact layer between the semiconductor layer 40 and the metal layer. Thereafter, the metal layer is removed. Then, the gate insulating layer 30, the semiconductor layer 40 and the metal silicide layer 50 are patterned at the same time by plasma etch using a second photolithography process. At this time, it is preferable that the etch rate for the semiconductor layer 40 is higher than that for the gate insulating layer 30, for example 3:1, to make tapered angle. The patterns 30, 40 and 50 extend along the gate wire 22, 24 and 26, fully covering them, as shown in FIG. 7A. At this time, contact holes 31 exposing the gate pads 24 are formed simultaneously.

The order of the manufacturing steps may vary. For example, the semiconductor layer 40 and the gate insulating layer 30 are patterned, and then the metal layer is deposited to form the silicide layer 50, and removed. In this case, since the metal layer is deposited directly on the gate pads 24 through the contact holes 31, the structure of the gate pads 24 may be changed depending on the material of the gate pads 24. For instance, the gate wire 22, 24 and 26 has a double-layered structure of an upper layer of aluminum or aluminum alloy and a lower layer of chromium, and the metal layer is made of molybdenum or molybdenum alloy by an aluminum etchant. At this time, since molybdenum or molybdenum alloy is etched. Therefore, when the metal layer is etched by an aluminum etchant after forming the metal silicide 50, the upper layer of aluminum or aluminum alloy is removed to expose the lower layer. Since the lower layer is the chromium layer, the contact property with ITO is good. Another example is that the gate wire 22, 24 and 26 has a double-layered structure of an upper layer of molybdenum or molybdenum alloy and a lower layer of aluminum or aluminum alloy, and the metal layer is made of chromium. At this time, when the metal layer is etched, the upper layer of molybdenum or molybdenum alloy is not etched.

In the meantime, a microcrystallized amorphous silicon layer may replace the silicide layer 50. The gate insulating layer 30, the semiconductor layer 40 and the microcrystallized amorphous silicon layer doped with N type are sequentially deposited and patterned.

A doped amorphous silicon layer and a suicide layer are used together as an ohmic contact layer.

Next, as shown in FIGS. 8A to 8C, a lower conductor layer of an ITO layer and an upper conductor layer of such as molybdenum-tungsten alloy or chromium are deposited and patterned to form a conductor pattern of double-layered structure including a plurality of data lines 62 and 72, a plurality of data pads 64 and 74, a plurality of source electrodes 65 and 75, a plurality of drain electrodes 66 and 76, a plurality pixel electrodes 63 and 73, and a plurality of redundant gate pads 67 and 77. The portion of the silicide layer 50, which is not covered with the conductor pattern, are removed to form an ohmic contact layer pattern 55, 56, 57 and 58.

As shown in FIGS. 3 to 5, a passivation layer 80 made of silicon nitride is deposited and patterned by dry etch using a fourth photolithography process to form openings 81, 82, 83, 84 and 85. Next, portions of the upper layer of the pixel electrodes 63 and 73, the redundant gate pad 67 and 77, and the data pad 64 and 74, which are not covered with the passivation layer 80, are removed. At this time, portions of the semiconductor layer 40, which are not covered with the passivation layer 80, are removed. Accordingly, the pixel electrodes 63 and 73, the redundant gate pads 67 and 77, and the data pads 64 and 74 includes almost only the lower conductor layer 63, 67 and 64, and the semiconductor layer 40 is divided into two portions 42 and 47 to expose the gate insulating layer 30 through the openings 84 and 85. Here, the passivation layer 80 and the semiconductor layer 40 may be continuously etched by using dry etch, and the etch gas of $(CF_4)/O_2$ having 10 to 1 of the etch rate of silicon nitride to amorphous silicon may be used.

Figure 9:
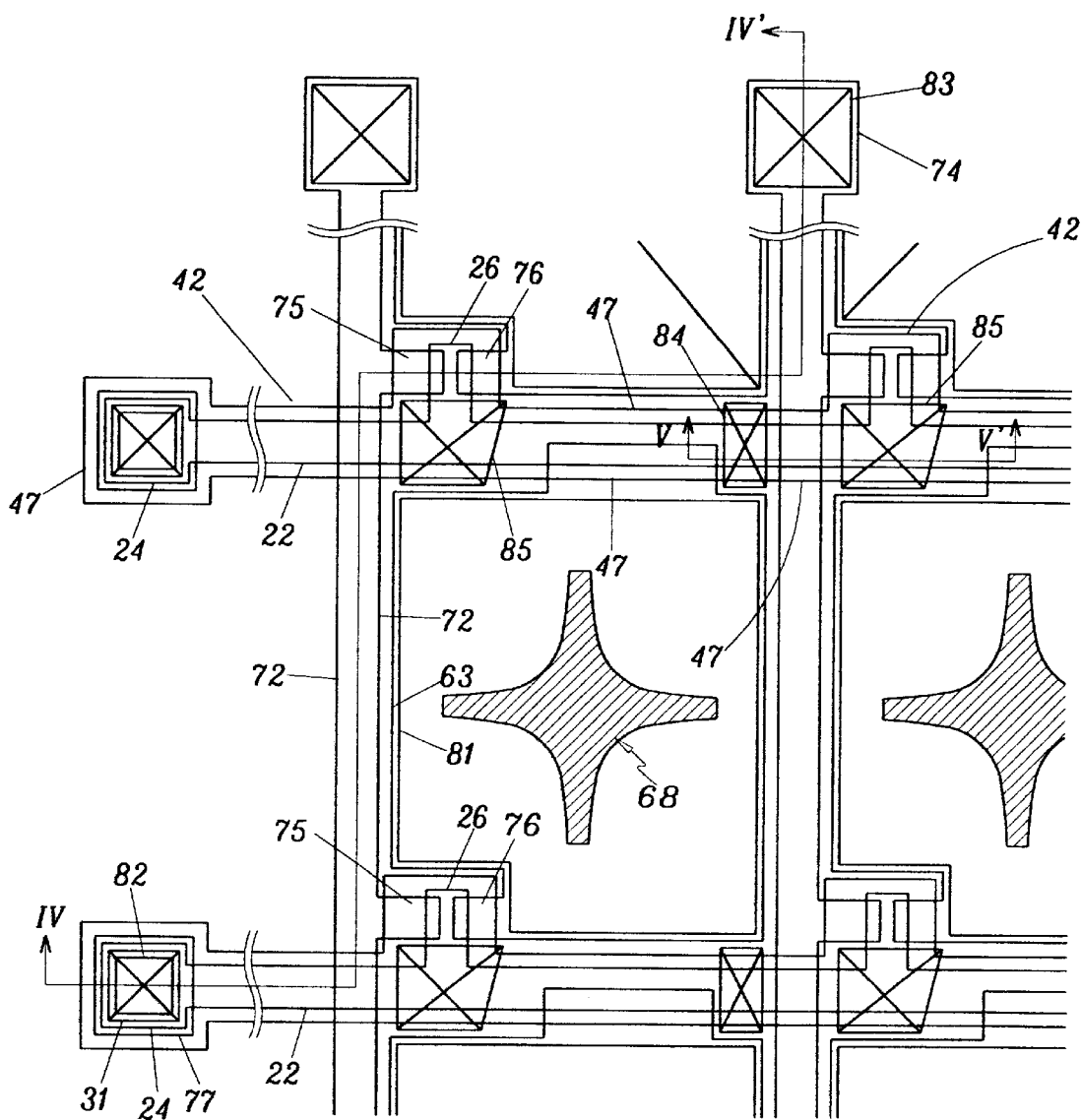
FIG. 9 is a layout view of a TFT array panel for an LCD according to the second embodiment of the present invention.

One of the modified structure of the TFT array panel is shown in FIG. 9.

FIG. 9 is a layout view of a TFT array panel for an LCD according to the second embodiment of the present invention.

As shown in FIG. 9, a pixel electrode 63 has on opening 68 with a shape of slit pattern to widen viewing angle. The curved fringe field formed at the edges of the opening 68 forms multi-domains where the average direction of the molecular axes of the liquid crystal layer are different from those in one pixel region, thereby enlarging viewing angle. The number of the openings in a pixel may be larger than one.

According to the present invention, the TFT array panel for the liquid crystal display can be manufactured by using the four photolithography steps, and the gate pads are sufficiently protected. In addition, the leakage current of the liquid crystal display is effectively reduced.

Next, photomasks having different transmittance depending on position in the step of patterning the gate insulating layer, the semiconductor layer and the ohmic contact layer are used to reduce the number of photolithography steps.

In these embodiments, when patterning the gate insulating layer to form contact holes exposing gate pads, the semiconductor layer and the ohmic contact layer are patterned at a time. At this time, a portion of a gate insulating layer in the display area remains but the gate insulating layer in the peripheral area is wholly removed.

Figure 10:
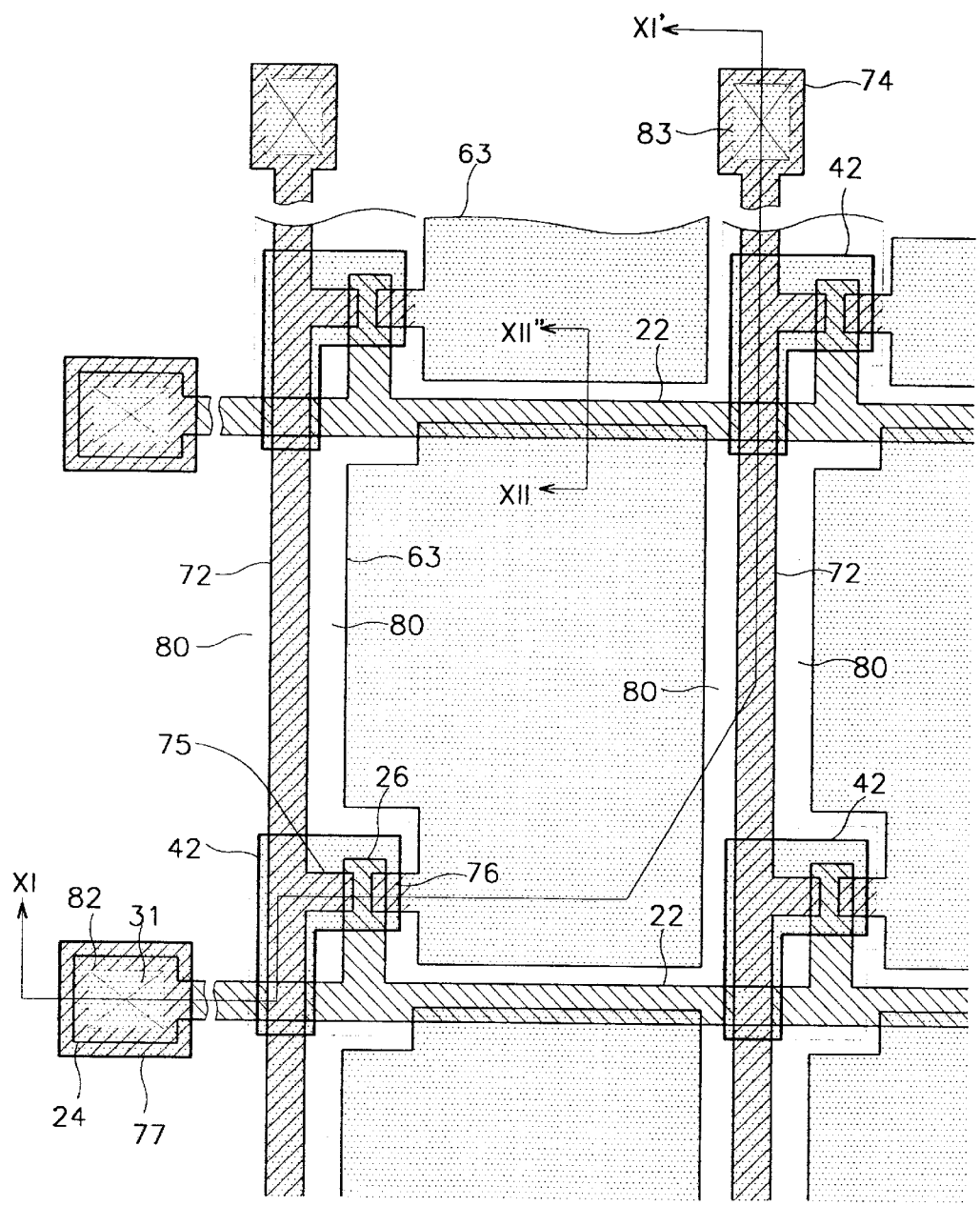
FIG. 10 is a layout view of a TFT array panel for an LCD according to the third embodiment of the present invention.
Figure 11:
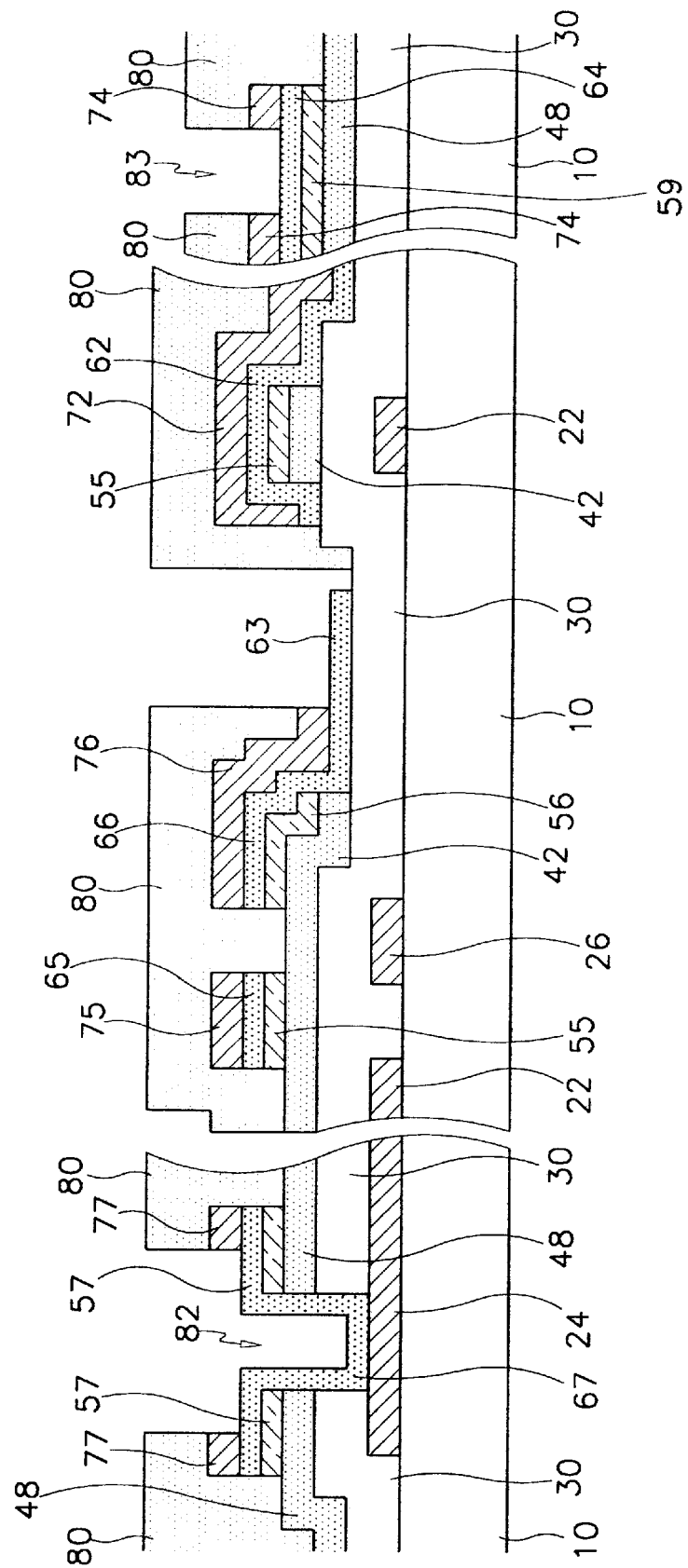
FIGS. 11 and 12 are cross-sectional views respectively taken along the line XI–XI' and XII–XII' of the FIG. 10.
Figure 12:
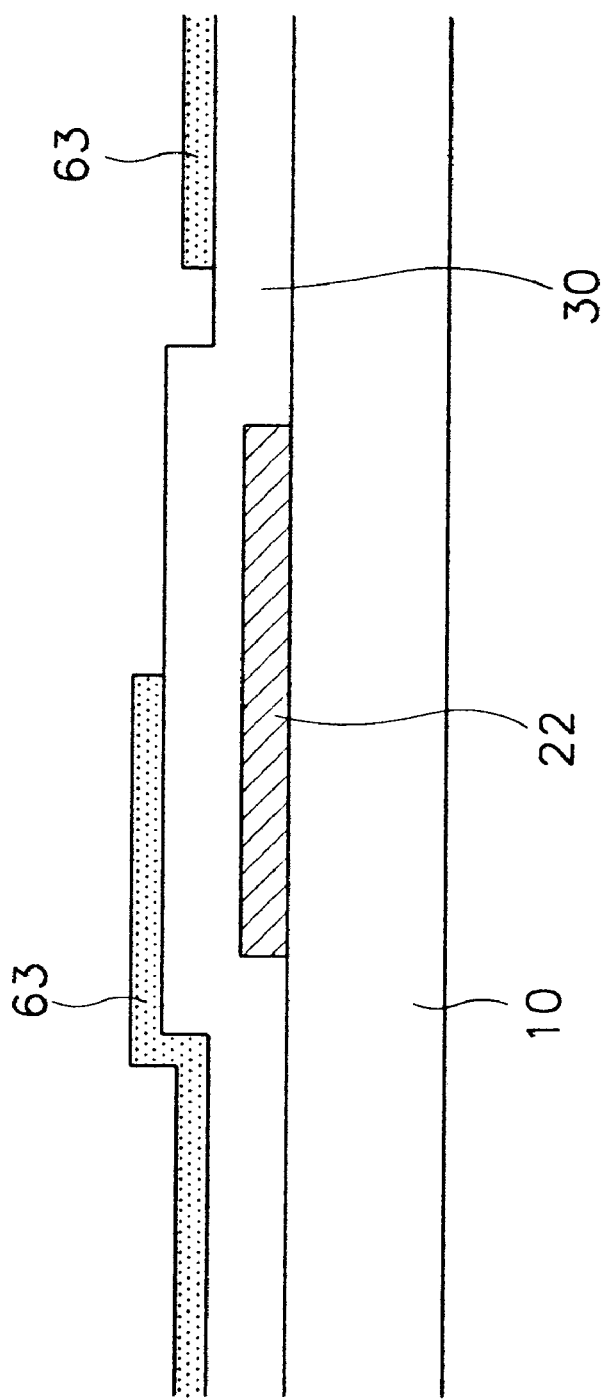

FIG. 10 is a layout view of a TFT array panel for an LCD according to the third embodiment of the present invention, and FIGS. 11 and 12 are cross-sectional views respectively taken along the line XI—XI and XII–XII' of the FIG. 10.

A gate wire of metal or conductive material such as aluminum (Al) or aluminum alloy, molybdenum (Mo) or molybdenum-tungsten (MoW) alloy, chromium (Cr) and tantalum (Ta) is formed on an insulating substrate 10. The gate wire includes a plurality of gate lines (scanning signal lines) 22 extending in the horizontal direction, a plurality of gate pads 24 which are connected to one ends of the respective gate line 22 and a transmit a scanning signals from an external circuit to the gate line 22, a plurality of gate electrodes 26 of TFTs, which are branches of the gate lines 22.

The gate wire 22, 24 and 26 may have a multiple-layered structure as well as a single-layered structure. When the gate wire 22, 24 and 26 has the multiple-layered structure, it is preferable that one layer is made of a material having low resistivity and another layer is made of a material having a good contact with other materials. The double layers of Cr/Al (or Al alloy) and Al/Mo are such examples.

A gate insulating layer 30 of silicon-nitride (SiNx) is formed on the gate wire 22, 24 and 26 and covers the same.

A semiconductor pattern 42 and 48 made of semiconductor such as hydrogenated amorphous silicon is formed on the gate insulating layer 30. An ohmic contact layer pattern 55, 56, 57 and 59 made of such as doped amorphous silicon heavily doped with impurity and silicide is formed on the semiconductor layer pattern 42 and 48.

In the meantime, the semiconductor layer pattern 42 and 48, and the ohmic contact layer pattern 55, 56, 57 and 59 of display area is formed in the portion where the gate wire 22, 24 and 26, and a data wire that will be described later overlap each other. The semiconductor pattern 42 and 48, and the ohmic contact layer pattern 55, 56, 57 and 59 of peripheral area is formed on the whole surface. Here, the ohmic contact layer pattern 55, 56, 57 and 59, the semiconductor pattern 42 and 48, and the gate insulating layer 30 on the gate pads 24 have contact holes 31 exposing the gate pads 24.

A first data layer pattern 62, 63, 64, 65, 66 and 67 made of transparent conductive materials such as ITO or opaque conductive materials is formed on the ohmic contact layer pattern 55, 56 and 58, and a second data layer pattern 72, 74, 75, 76 and 77 made of conductive materials such as Mo or MoW, Cr, Al or Al alloy and Ta is formed on the first data layer pattern 62, 63, 64, 65, 66 and 67. The data wire has a plurality of data line parts, each including a data line 62 and 72 extending in the vertical direction, a plurality of data pads 64 and 74 that are connected to one ends of data lines 62 and 72 and transmit image signals from an external circuit to the data lines 62 and 72 and a plurality of source electrodes 65 and 75 of a TFT, which are branches of data lines 62 and 72. The data wire also has a plurality of drain electrodes 66 and 76 of the TFTs, which are opposite to the respective source electrodes with respect to the respective gate electrodes 26 and separated from the data line parts, a plurality of pixel electrodes 63 connected to the drain electrodes 66 and 76, and a plurality of redundant gate pads 66 and 77 formed on the gate pads 24 and connected to the gate pads 24 through the contact holes 31. Here, the data line 62 and 72, the source electrode 65 and 75, and the drain electrode 66 and 76 have a double-layered structure. The portion of the redundant gate pad 67 and 77, and the data pad 64 and 74 have a double-layered structure, but the rest of the redundant gate pad 67 and 77, and the data pad 64 and 74 are made of the first data layer pattern 67 and 64. The pixel electrode 63 has the single layered structure of the first data layer pattern 67 and 64.

The second data layer pattern 72, 74, 75, 76 and 78 may have a multiple-layered structure like the gate wire 22, 24 and 26. Of course, when the data wire has a multiple-layered structure, it is preferable that one layer is made of a material having a low resistivity and the other is made of a material having a good contact with other materials.

The ohmic contact layer pattern 55, 56 and 58 plays a role to reduce the contact resistance between the semiconductor layer pattern 42 and 48 and the first data layer pattern 62, 63, 64, 65, 66 and 67, is only formed therebetween.

The second data layer pattern 72, 74, 75, 76 and 77 and the semiconductor layer pattern 42 and 48 are covered with a passivation layer 80. The passivation layer 80 plays a role to protect the channel of the semiconductor 42 between the source electrode 75 and the drain electrode 76 at least. The passivation layer 80 may be made of an insulating material such as SiNx or acrylic organic material.

In this embodiment, transparent ITO is taken as an example of the material of the pixel electrode 63, but an opaque-conductive material may be used in a reflective type LCD.

Now, a manufacturing method of a TFT array panel according to an embodiment of the present invention will be described with reference to the FIGS. 13A to 19C as well as FIGS. 10 to 12.

Figure 13A:
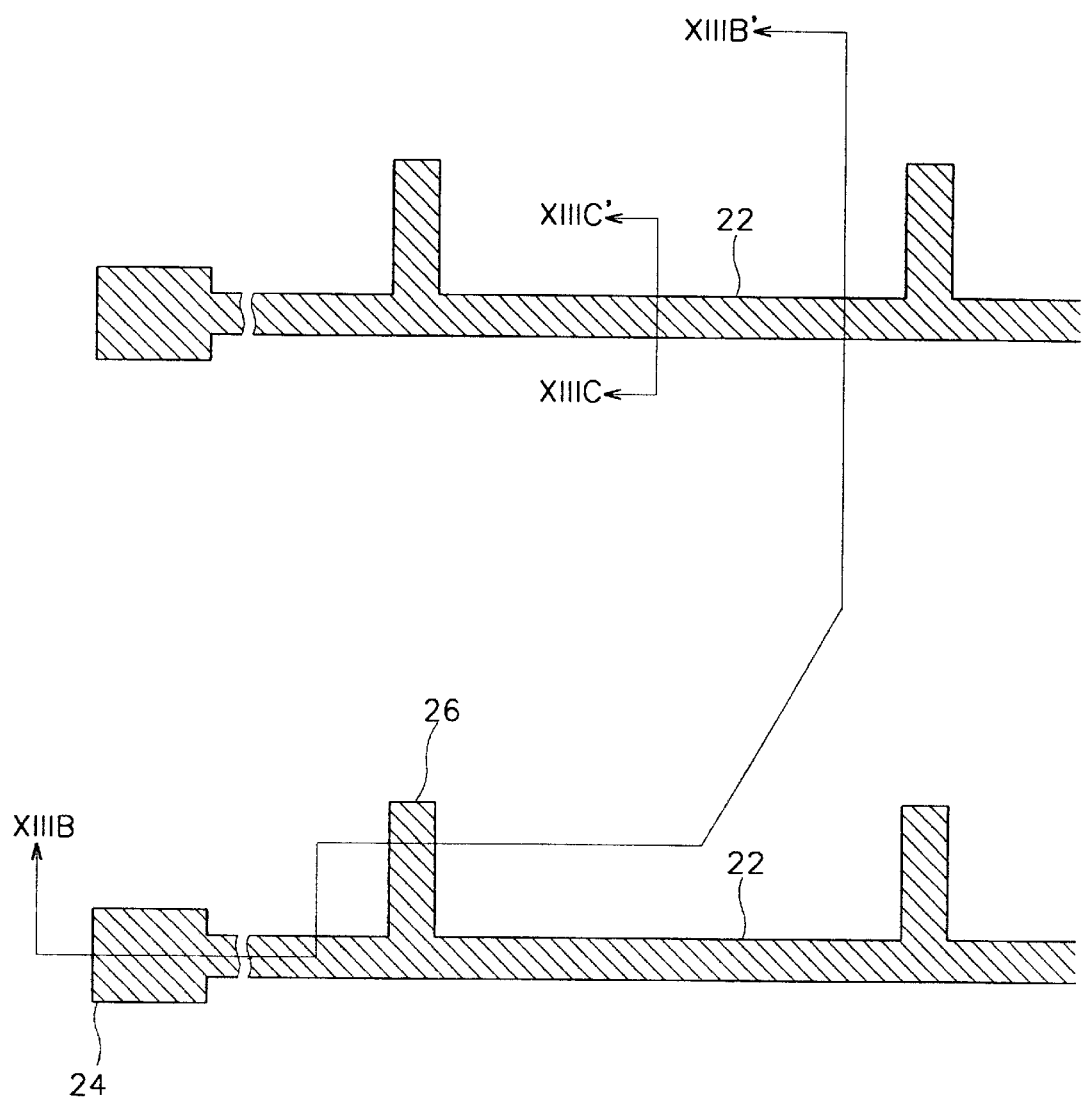
FIG. 13A is a layout view of a TFT array panel in the first manufacturing step according to the third embodiment of the present invention.
Figure 13B:
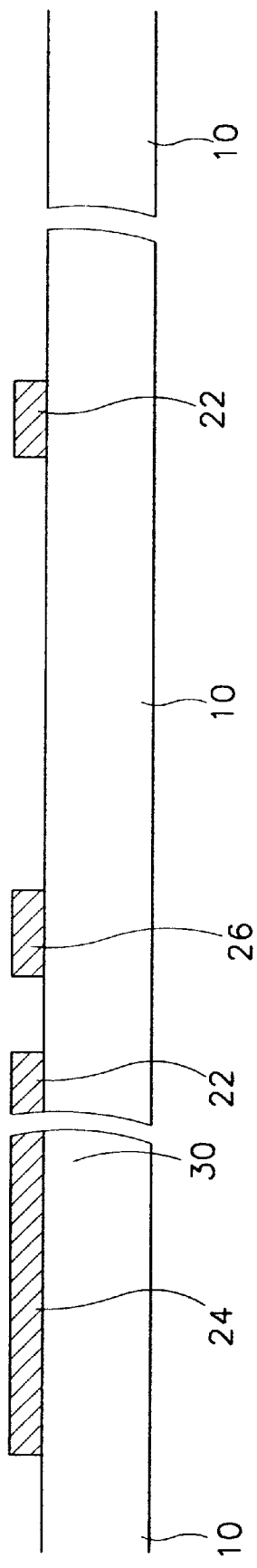
FIGS. 13B and 13C are respectively the cross-sectional views taken along the line XIIIB–XIIIB' and XIIIC–XIIIC' of the FIG. 13A.
Figure 13C:
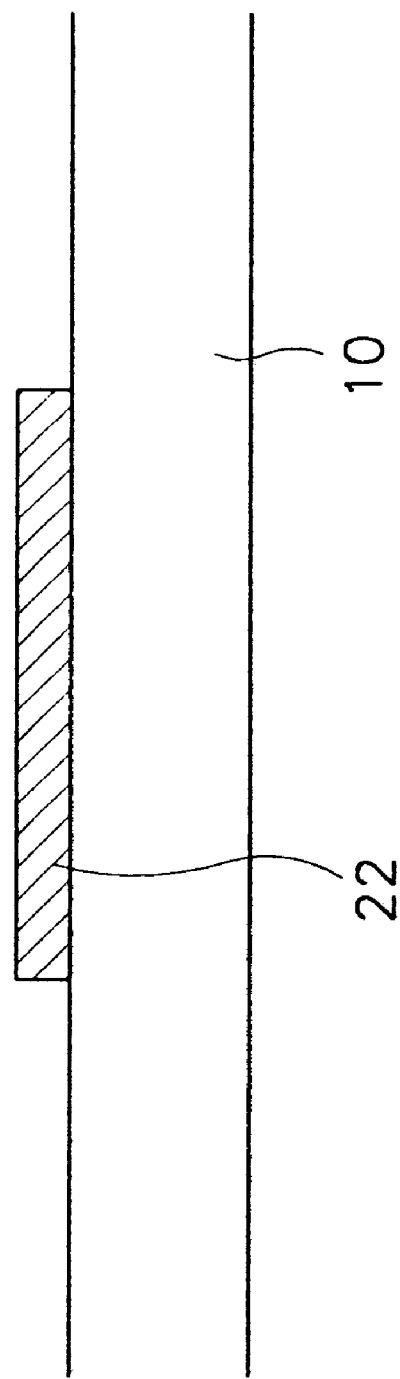

First, as shown in FIGS. 13A to 13C, a conductor layer of such as a metal with a thickness 1,000 Å to 3,000 Å is deposited on a substrate 10 by such a method as sputtering, and a gate wire including a plurality of gate lines 22, a plurality of gate pads 24 and a plurality of gate electrodes 26 is formed by dry or wet etch using the first photolithography step.

Figure 14A:
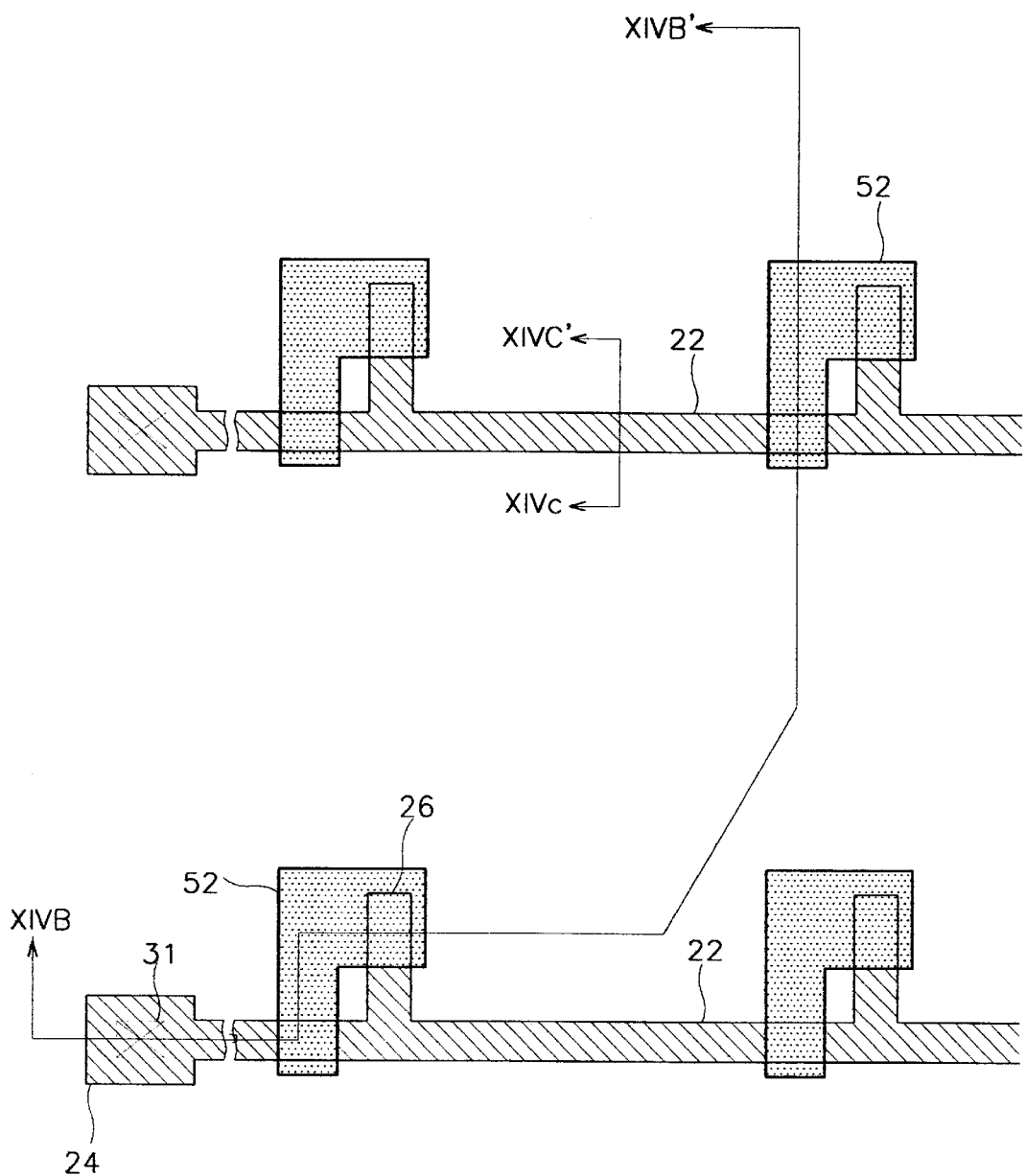
FIG. 14A is a layout view of a TFT array panel in a manufacturing step following the FIGS. 13A to 13C.
Figure 14B:
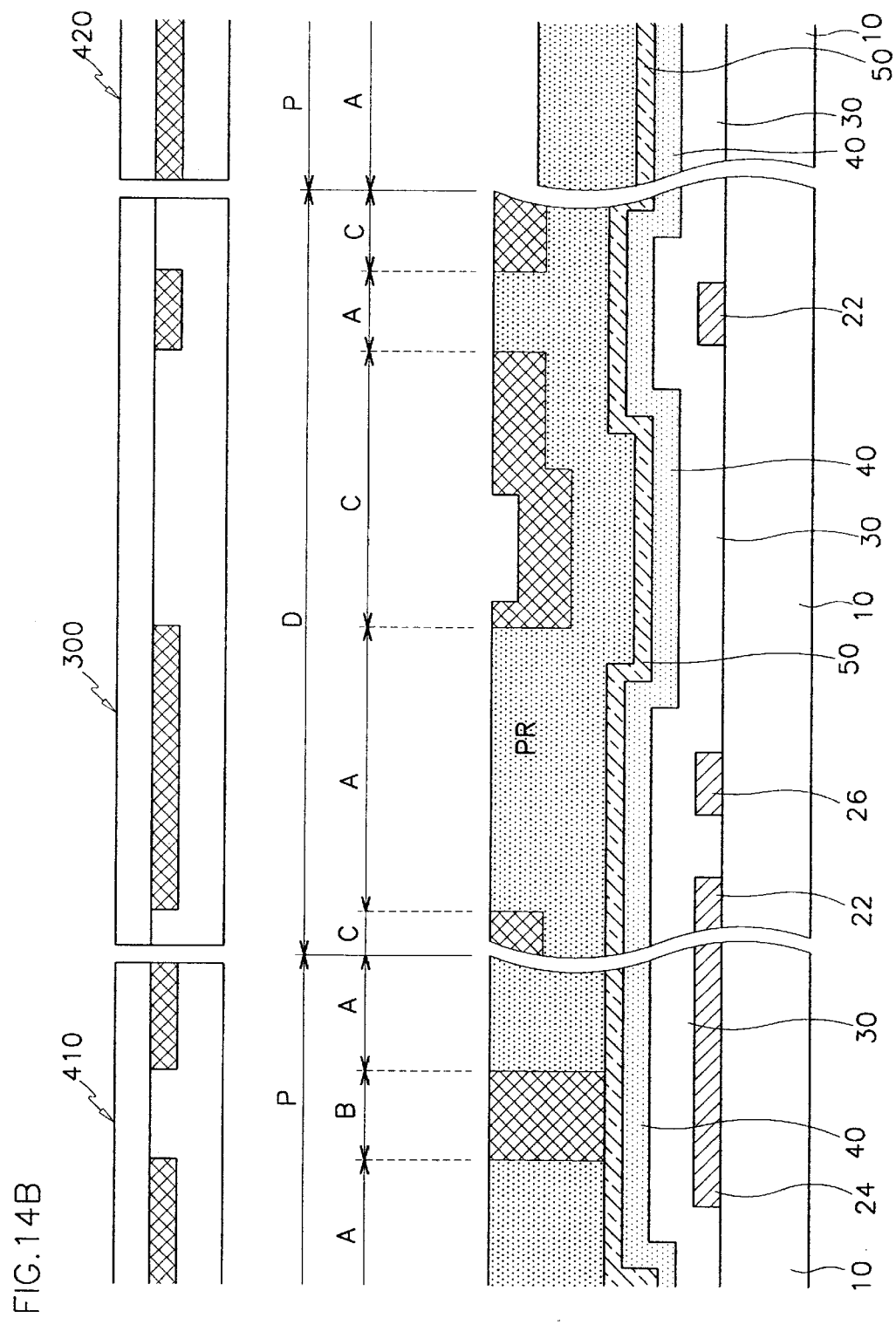
FIGS. 14B and 14C are respectively the cross-sectional views taken along the line XIVB–XIVB' and XIVC–XIVC' of the FIG. 14A.
Figure 14C:
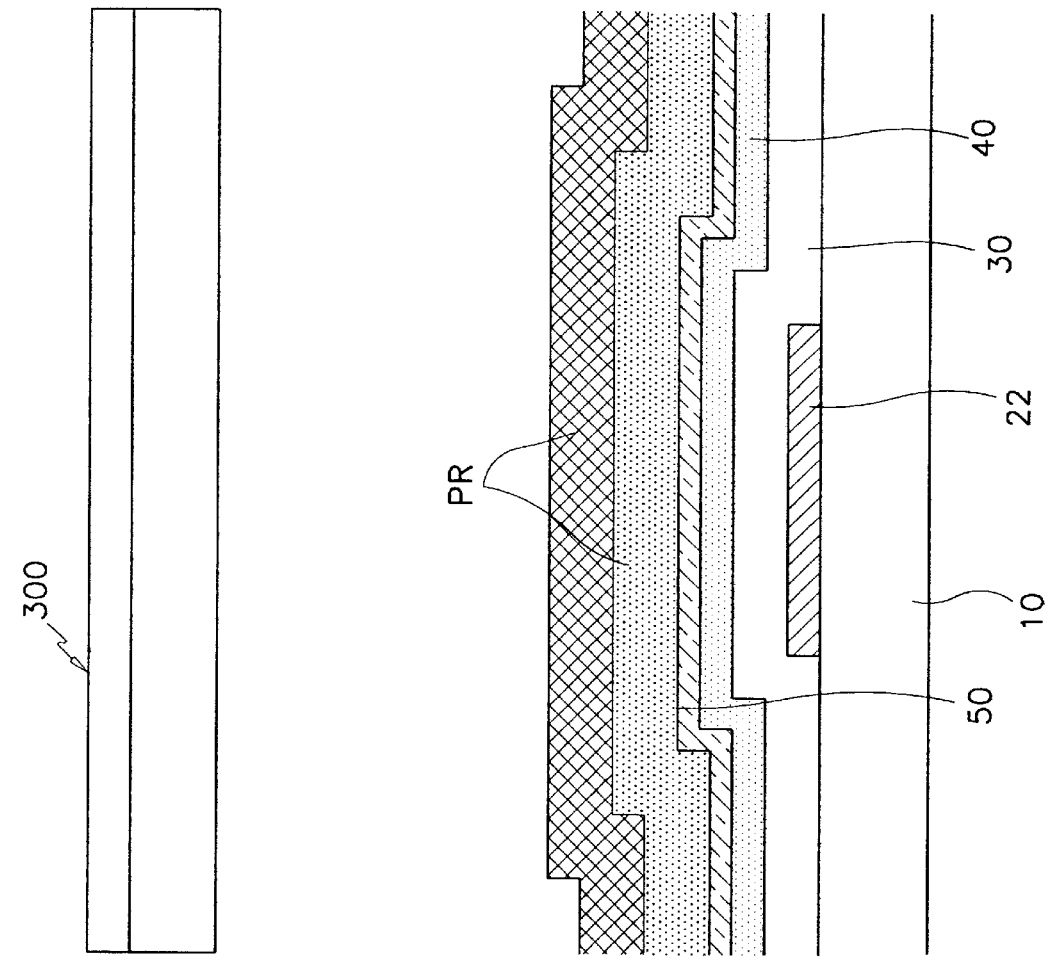

Next, as shown in FIGS. 14A to 14C, a gate insulating layer 30 and a semiconductor layer 40 with the respective thickness of 1,500 Å to 5,000 Å and 500 Å to 1,500 Å are sequentially deposited by such as chemical vapor deposition (CVD). Then, the metal layer (not shown) made of refractory metal, which can be silicified, such as chromium and molybdenum is deposited on the semiconductor layer 40 to form a metal silicide layer 50 with a thickness of 300~600 Å as an ohmic contact layer and the metal layer removed. Then, the metal silicide layer 50, the semiconductor layer 40, the gate insulating layer 30 are patterned at a time by using the second photolithography to form a semiconductor layer pattern 42 and 48, a silicide pattern 52 and 58, and contact hole 31 (referring to FIGS. 18A and 18B). At this time, the portions of the silicide layer 50, the semiconductor layer 40 and the gate insulating layer 30 on the gate pad 24 in the peripheral area P are removed. However, in the display area, the gate insulating layer 30 should remain. Only the portions of the silicide layer 50 and the semiconductor layer 40 is removed, except for those under the semiconductor layer pattern 42 and 48, the silicide pattern 52 and 58. For this purpose, a photoresist (PR) pattern is formed to have a thickness that varies depending on the location, and the layers under the PR pattern are dry etched by using the PR pattern as an etch mask. It will be described with reference to the FIGS. 14B to 18B.

At first, a layer of preferably positive photoresist with a thickness of 5,000 Å to 30,000 Å is coated on the silicide layer 50, and exposed to light trough a mask or masks 300, 410 and 420. As shown in the FIGS. 14B and 14C, the PR layer in the display area D is different from that in the peripheral area P. In concrete, in the display area D, polymers in exposed portions of the PR layer in the regions C are resolved from the surface to a certain depth and remained intact beyond that depth. However, in the peripheral area P, polymers in the regions B that is exposed to light are entirely resolved from the surface to the bottom. The portions of the silicide layer 50 in the regions C and B are subject to removal.

For this purpose, a mask portion 300 for the display area D may have structures different from mask portions 410 and 420 for the peripheral area P. Three of such examples will be described referring to FIGS. 15A to 17.

The first example and the second example use two pieces of photomasks for the display area D and the peripheral area P.

Figure 15A:
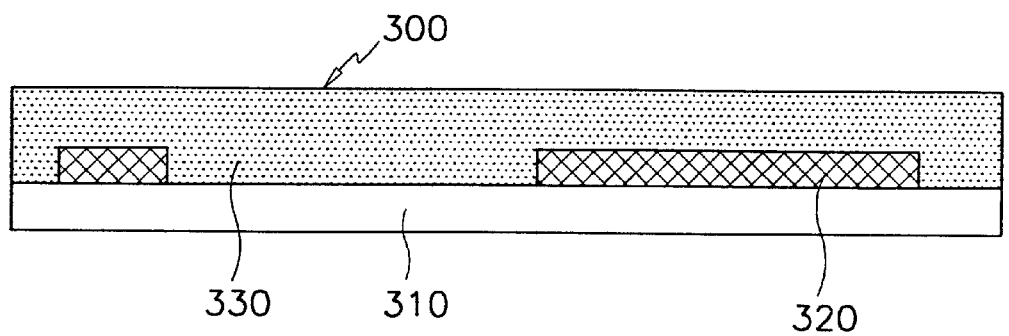
FIGS. 15A and 15B, FIGS. 16A and 16B and FIG. 17 are respectively cross-sectional view of photomasks used in the manufacturing step of FIGS. 14A to 14C.
Figure 15B:
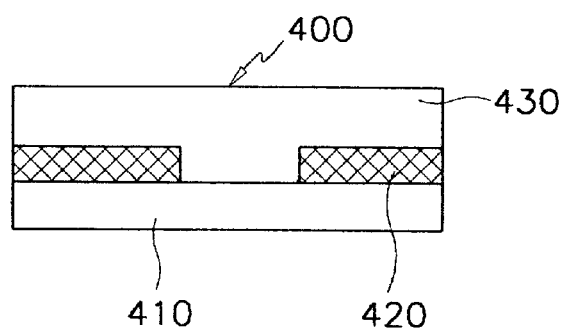

First, as shown in FIGS. 15A and 15B, masks 300 and 400 include mask substrates 310 and 410, opaque pattern layers 320 and 420 of such as Cr thereon, and pellicles 330 and 430 covering the opaque pattern layer 320 and 420 and the exposed portions of the substrates 310 and 410, respectively. The light transmittance of the pellicle 330 of the mask 300 for the display area D is lower than that of the mask 400 for the peripheral area P. It is preferable that the light transmittance of the pellicle 330 is 10% to 80%, more preferably 20% to 60%, of that of the pellicle 430.

Figure 16A:
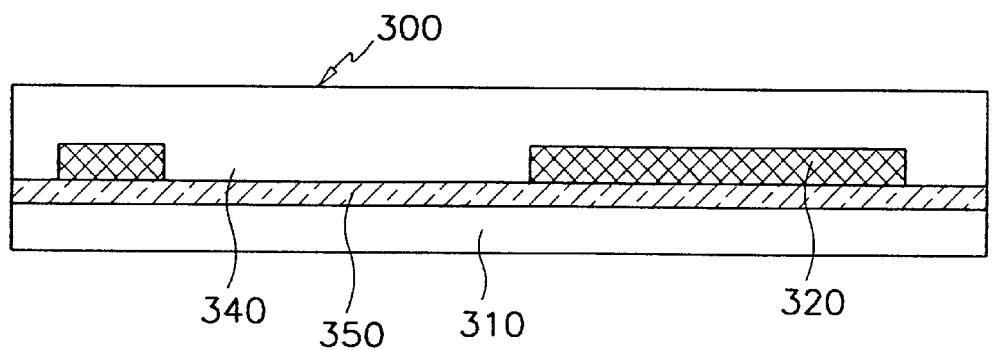
Figure 16B:
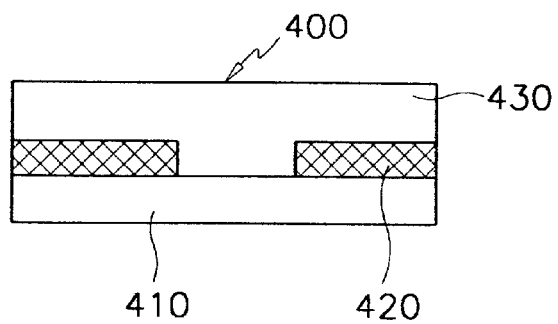

Next, as shown in FIGS. 16A and 16B, a Cr layer 350 with a thickness of 100 Å to 300 Å is formed on a mask substrate 310 of a mask 300 for the display area D to reduce the light transmittance, while there is no Cr layer in a mask 400 for the peripheral area P. The light transmittance of a pellicle 340 of the mask 300 may be equal to that of a pellicle 430 of the mask 400.

The above two structures may be used mixed together.

Above two examples are available for a step-and-repeat exposure method using a stepper, since the mask 300 for the display area D and the mask 400 for the peripheral area P are made of separate pieces. In the meantime, the thicknesses of the PR layer may be controlled by adjusting the exposure time.

However, the display area D and the peripheral area P may be exposed to light through a single mask. A structure of such a mask will be described with reference to the FIG. 17.

Figure 17:
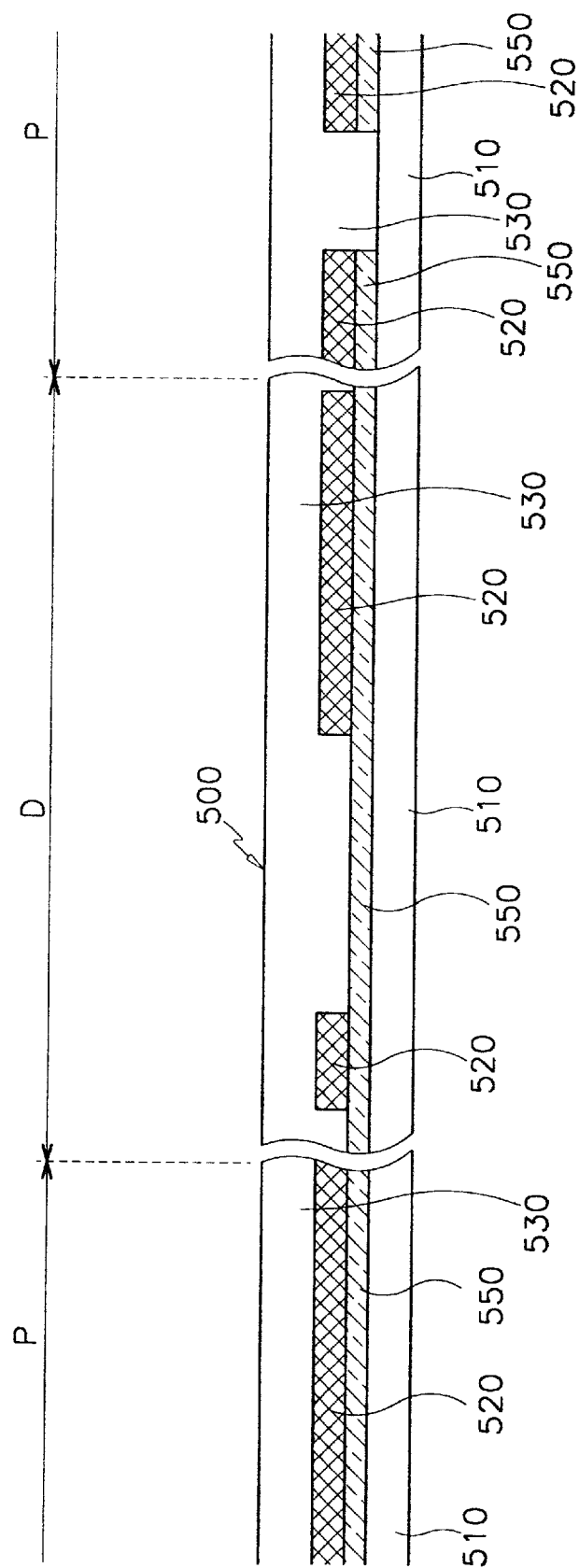

As shown in FIG. 17, a transmittance controlling layer 550 is formed on a substrate 510 of a photomask 500, and a pattern layer 520 is formed on the transmittance controlling layer 510. The transmittance controllable layer 550 is provided not only under the pattern layer 520 but also in the entire area for the display area D while provided only under the pattern layer 520 in the peripheral area P. As a result, the substrate 510 has at least two patterns, one of the transmittance controlling layer 550 and the other the double layers of the pattern layer 520 and the transmittance controlling 550, having different thickness.

A transmittance controlling layer may be provided in the area for the peripheral area P. At this time, the transmittance of the transmittance controllable layer for the peripheral area P should be higher than that for the display area D.

To manufacture a photomask 500 having the transmittance controlling layer 550, on the substrate 500 are sequentially deposited a transmittance controlling layer 550 and a pattern layer 520 that has an etch ratio different from the transmittance controlling layer 550. A PR layer (not shown) is coated on the pattern layer 520, exposed to light and developed. Then the pattern layer 520 is etched by using the PR layer as an etch mask. Next, the remaining PR is removed. A new PR pattern (not shown) exposing the transmittance controlling layer of the portion corresponding to contact hole of the peripheral area is formed. Then the transmittance controlling layer 550 is etched to obtain a complete photomask 500 by using the new PR layer as an etch mask.

In another way, the transmittance may vary depending on the position using a mask that has slits or a grid pattern smaller than the resolution of the exposure equipment.

Accordingly, one photomask that does not differentiate the display area from the peripheral area may be used. The photomask may differently control the transmittance of the first area facing the contact hole 31, the second area facing the semiconductor layer pattern 42 and 48, and the third area facing the rest of the area except the first area and the second area. Then, as shown in FIG. 14B, the PR pattern is formed to have a first portion B, where a photoresist is removed or remaining slim, a second portion A having a first thickness and a third portion C having a second thickness thinner than the first thickness.

Meanwhile, portions of PR layer over the metal patterns such as the gate wire 22, 24 and 26 having high reflectivity may be exposed to more light than other portions. To prevent this problem, a layer to block the light reflected by the metal patterns may be provided or a colored PR layer may be used.

Figure 18A:
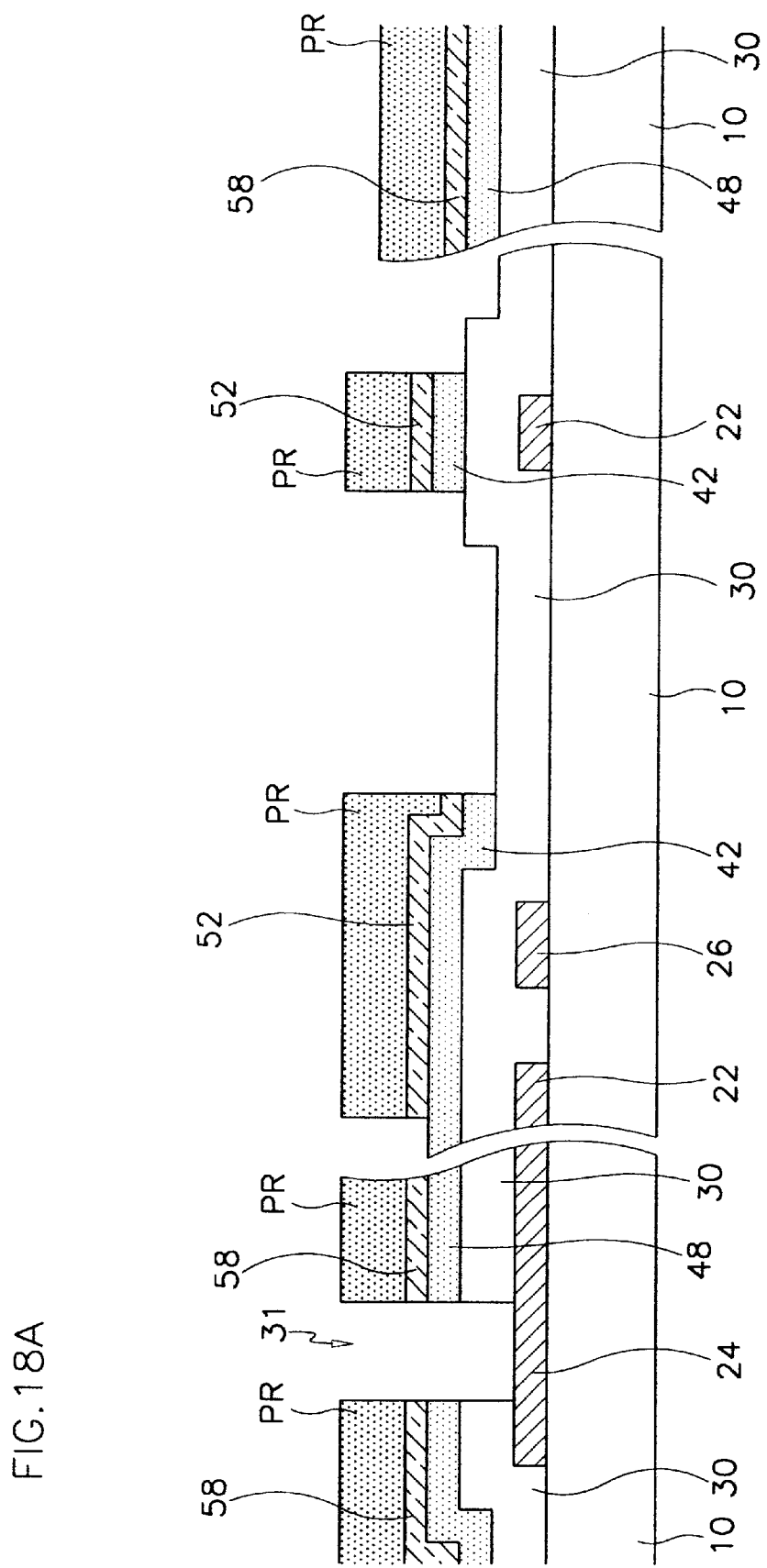
FIGS. 18A and 18B are respectively the cross-sectional views taken along the line XIVB–XIVB' and XIVC–XIVC' of the FIG. 14A in the manufacturing step following the FIGS. 14B and 14C.
Figure 18B:
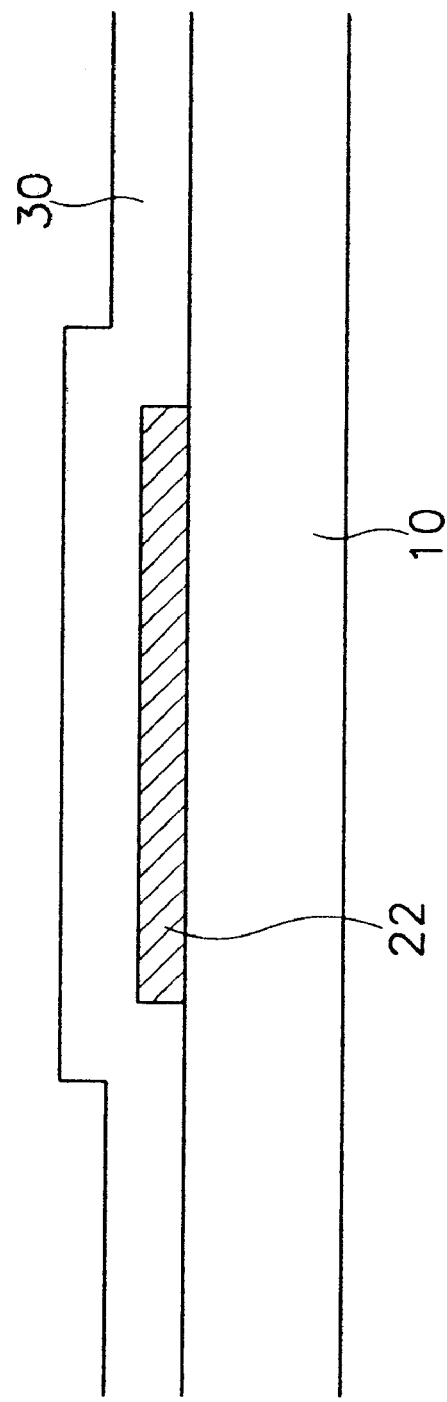
Figure 19A:
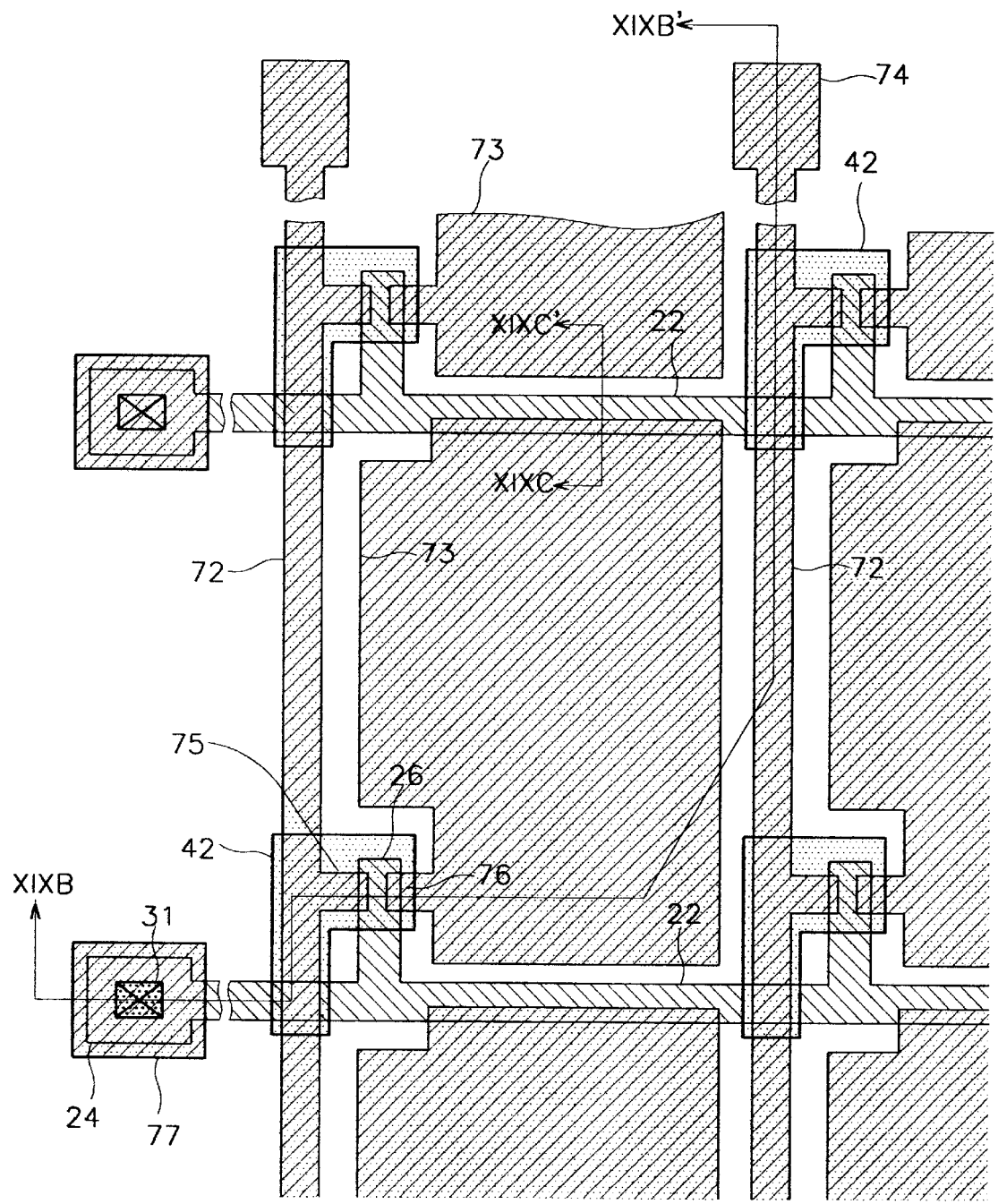
FIG. 19A is a layout view of a TFT array panel in a manufacturing step following the FIGS. 18A to 18B.
Figure 19B:
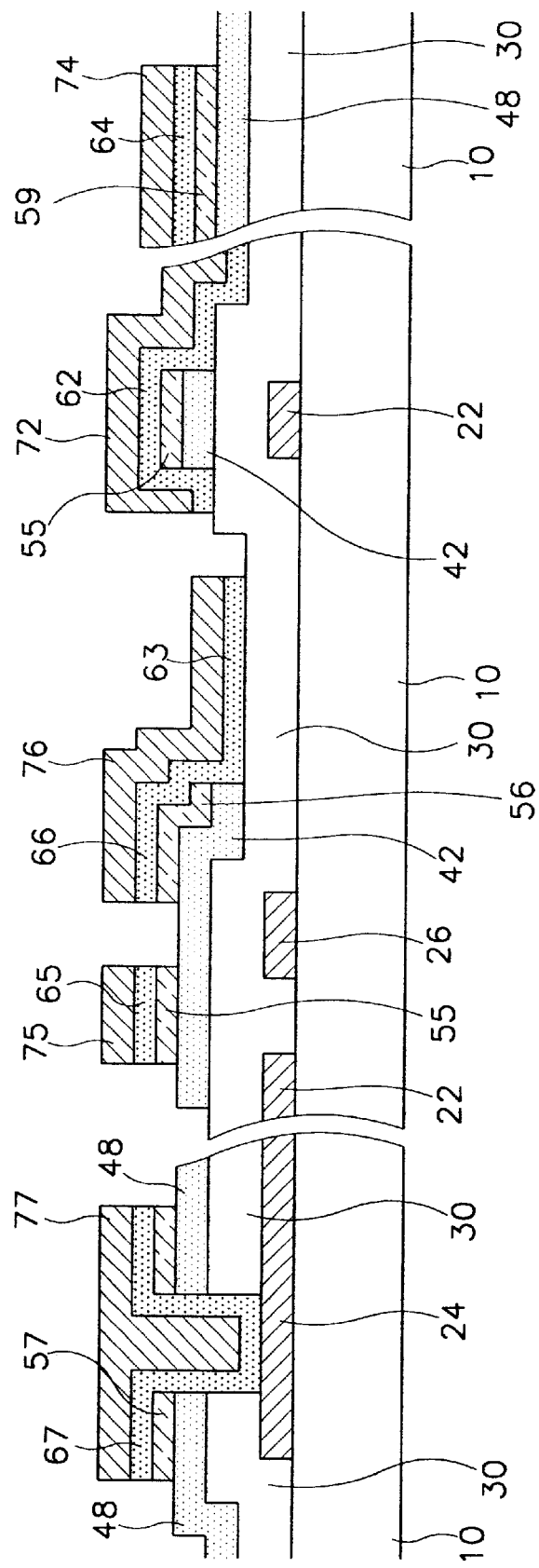
FIGS. 19B and 19C are respectively the cross-sectional views taken along the line XIXB–XIXB' and XIXC–XIXC' of the FIG. 19A.
Figure 19C:
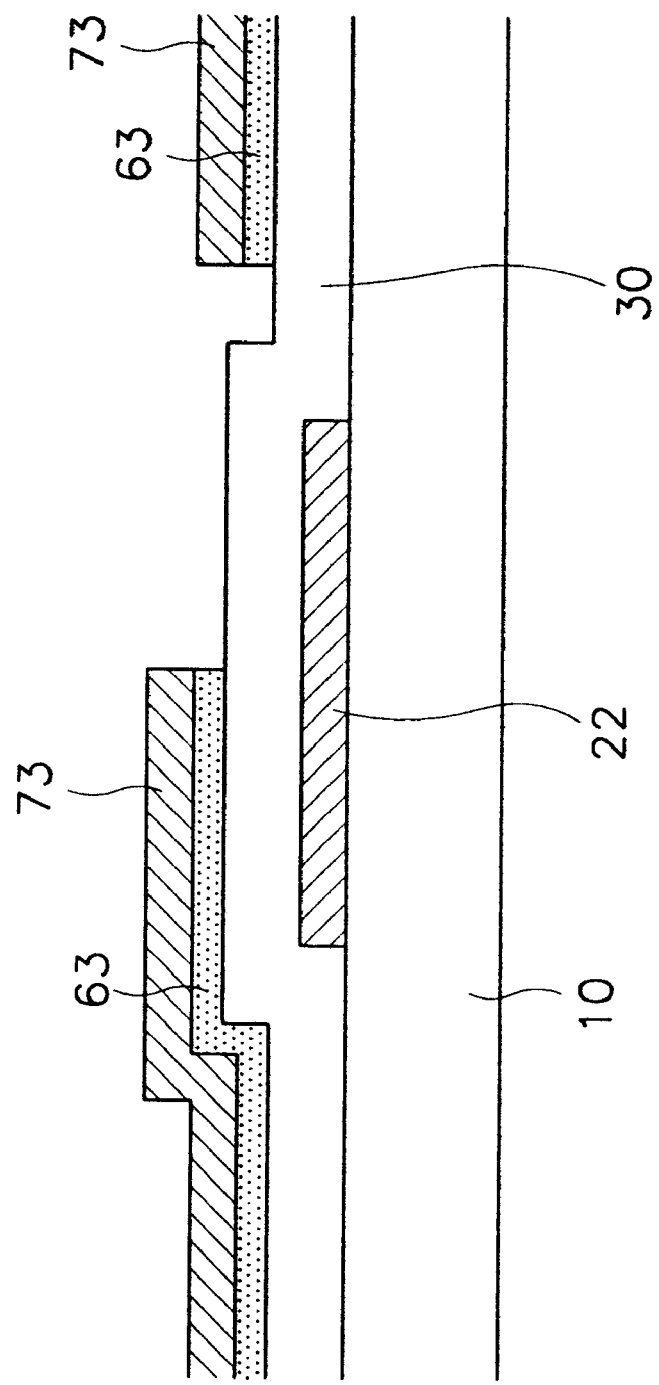

The PR layer shown in FIGS. 14B and 14C is exposed to light by the above described method, and developed to form a PR pattern shown in FIGS. 18A and 18B. In concrete, there is no PR over a portion of the gate pad 24. Thick portions of the PR pattern in the region A are located in the peripheral area P except for the gate pad 24, and located over the silicide layer 50 on the portion of the semiconductor layer pattern of the display area D. Thin portions of the PR pattern in the region C is located over the remaining portions of the display area D.

At this time, it is preferable that the thickness of the thin portions is ¼ to ⅐ of the initial thickness, in other words 350 Å to 10,000 Å, and more preferably 1,000 Å to 6,000 Å. For example, when the initial thickness of the PR layer is 25,000 Å to 30,000 Å, the thin portions may have thickness of 3,000 Å to 7,000 Å by setting the transmittance for the display area D to 30%. However, since the thickness of the PR pattern should be determined by the dry etch condition, the etch condition should control the transmittance of the pellicles, the thickness of the Cr layer, the transmittance of the transmittance controllable layer and the exposure time, etc.

The thin portion of the PR pattern may be formed by reflow after a normal exposure and a normal development.

Then, the PR pattern and the underlying layers, i.e., the silicide layer 50, the semiconductor layer 40 and the gate insulating layer 30 are dry etched.

At this time, as described above, the portions of the PR pattern in the region A should be remain, and the portions of the silicide layer 50, the semiconductor layer 40 and the gate insulating layer 30 in the region B should be removed. The portions of the suicide layer 50 and the semiconductor layer 40 in the region C should be removed, while the portions of the gate insulating layer 30 in the region C should remain.

For this purpose, it is preferable to use a dry etch that may etch the PR pattern along with the underlayers. As shown in FIGS. 18A and 18B, three layers in the Region B of the silicide layer 50, the semiconductor layer 40 and the gate insulating layer 30, as well as three layers in Region C of the thin portions of the PR pattern, the silicide layer 50 and the semiconductor layer 40, may be etched at a time by dry etch. The thick portions of the PR pattern in the region A are also etched to a certain depth by the etch.

According to the above method, only the silicide layer 50 and the semiconductor layer 40 are removed to form the semiconductor layer patterns 42 and 48 and the silicide patterns 52 and 58 in the display area D, and the silicide layer 50, the semiconductor layer 40 and the gate insulating layer 30 are removed to form contact hole 31 by only one photolithography step.

Next, the remaining PR pattern of the portion A is stripped. As shown in the FIGS. 19A to 19B, an ITO layer with a thickness of 400 Å to 500 Å and a conductor layer of such as metal with a thickness of 1,500 Å to 3,000 Å are deposited by such as sputtering. The conductor layer, the ITO layer and the suicide pattern 52 and 58 thereunder are patterned to form a data wire and an ohmic contact layer pattern 55, 56, 57 and 59 shown in FIGS. 19A to 19C by using the third photolithography step. At this time, the data wire is not yet completed and two layers have the same shape.

Next, as shown in FIGS. 10 to 12, a passivation layer 80 is formed to have a thickness over 3,000 Å by CVD of SiNx or spin coating of organic insulator. Then, the passivation layer 80 are patterned by using the fourth photolithography step to expose portions of the second data layer pattern 73, 77 and 74 that cover the pixel electrode 63, the redundant gate pad 67 and the data pad 64, respectively.

Finally, the exposed portions of the second data layer pattern 73, 77 and 74 is removed to complete the TFT array panel.

Here, the opening that exposes the pixel electrode 63 may be formed as in FIG. 3. At this time, the edge of the pixels electrode 63 may be exposed through the opening, and the gate insulating layer pattern 30 exposed through the opening may be additionally etched.

In the present embodiment, the contact hole 31 exposing the gate pad 24 is formed with the semiconductor layer pattern 42 and 48, and the silicide pattern 52 and 58 by one photolithography step. Accordingly, the number of photomasks is reduced.

Although, in the present embodiment, the pixel electrode is formed in a wide planar type, it may be formed in a linear type. Furthermore, a common electrode that drives liquid crystal molecules along with the pixel electrode may be formed on the same substrate as the pixel electrode is.

This case will be described through the fourth embodiment in detail by referring to FIGS. 20 to 25C.

Figure 20:
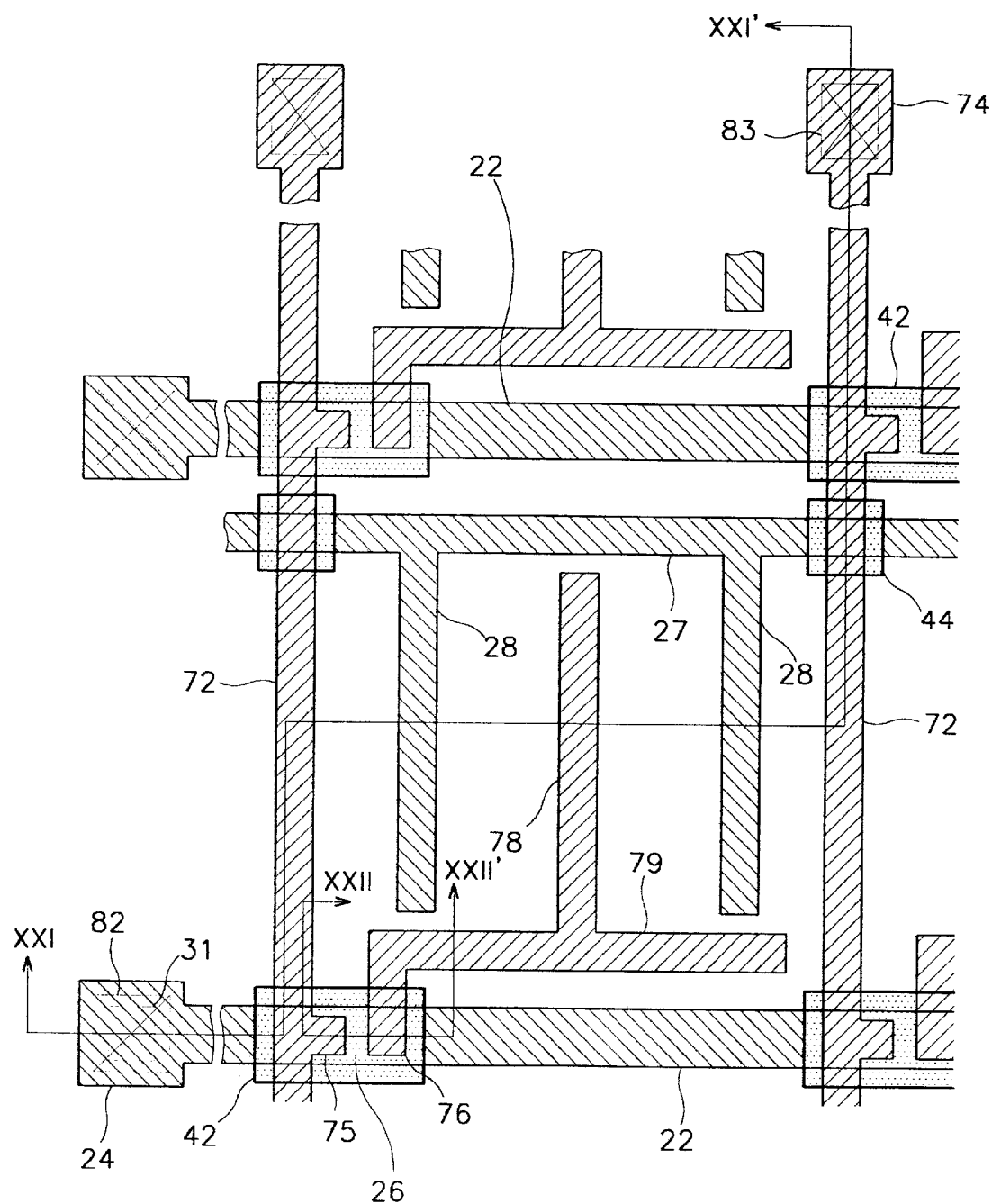
FIG. 20 is a layout view of a TFT array panel for an LCD according to the fourth embodiment of the present invention.
Figure 21:
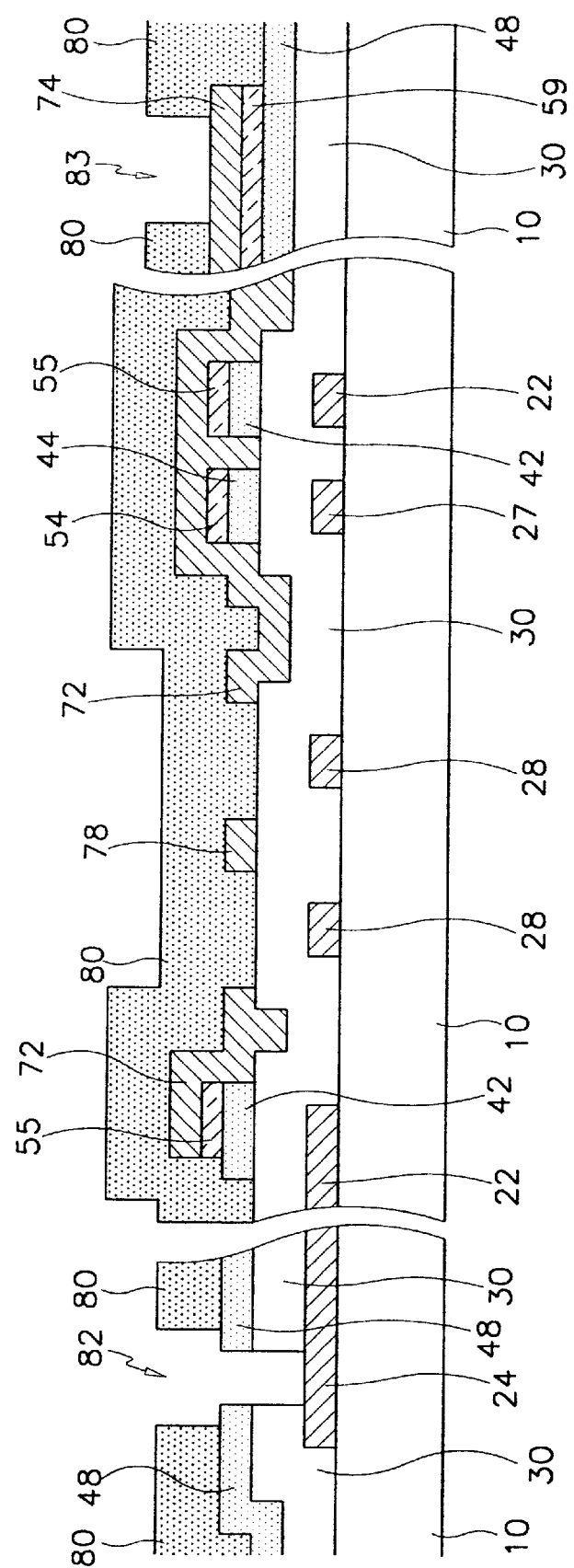
FIGS. 21 and 22 are cross-sectional views respectively taken along the line XXI–XXI' and XXII–XXII' of the FIG. 20.
Figure 22:
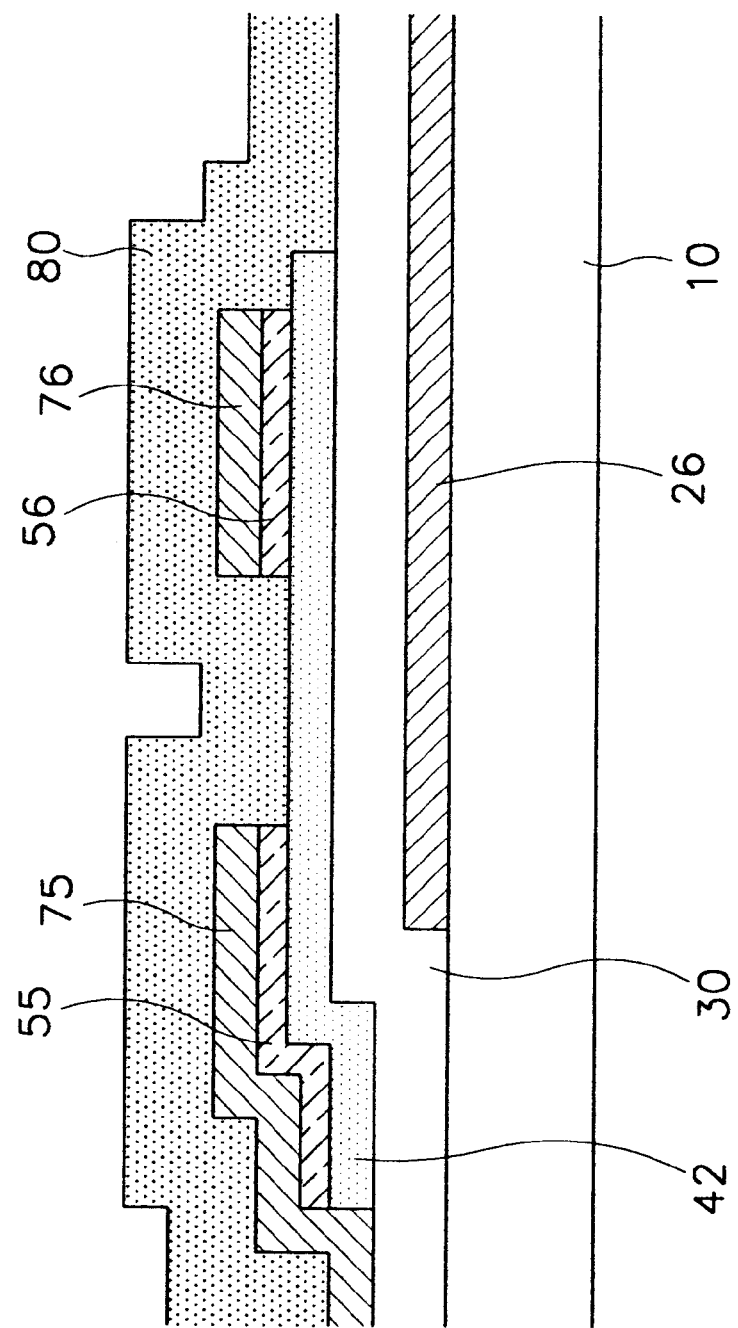

FIG. 20 is a layout view of a TFT array panel for an LCD according to the fourth embodiment of the present invention. FIGS. 21 and 22 are cross-sectional views respectively taken along the line XXI–XXI' and XXII–XXII' of the FIG. 20.

At first, a gate wires of metal or conductive material such as aluminum (Al) or aluminum alloy, molybdenum (Mo) or molybdenum tungsten alloy (MoW), chromium (Cr), and tantalum (Ta) is formed on an insulating substrate 10. A gate wire includes a gate line (scanning signal line) 22 extending in the horizontal direction, a gate pad 24 connected to an end of the gate line 22 and transmitting a scanning signal from an external circuit to the gate line 22, a gate electrode 26 which is a part of thin film transistor.

Also, a common wire made of the same material as the gate wires 22, 24 and 26 is formed on an insulating substrate 10. The common wires includes a common electrode line 27 extending in the horizontal direction and in parallel with the gate line 22 and common electrodes 28 that are the transverse branch of the common electrode line 27. The common wires may also include a common pad (not shown) connected to an end of the common electrode line 27, transmitting a common signal from an external circuit to the common electrode line 27, and having the nearly same shape as the gate pad 24.

A gate insulating layer pattern 30 of silicon-nitride (SiNx) is formed on the gate wire 22, 24 and 26, and the common wire 27 and 28 with the thickness of 2,500 Å~3,000 Å, covering them.

A semiconductor layer pattern 42, 44 and 48 made of semiconductor such as hydrogenated amorphous silicon is formed on the gate insulating layer 30. An ohmic contact layer pattern 54, 55, 56 and 59 made of such as amorphous silicon heavily doped with such as N type impurities and sulicide is formed on the semiconductor layer pattern 42 and 48.

In the meantime, the semiconductor layer pattern 42, 44 and 48 of display area is formed in the portion where the gate wires 22, 24 and 26, and the common wire 27 and 28 overlap data wires to be described later. The semiconductor layer is formed on the whole peripheral area. However, semiconductor layer pattern 42, 44 and 48, and the gate insulating layer 30 on the gate pad 24 have a contact hole 31 exposing the gate pad 24.

A data wire 72, 74, 75, 76, 77, 78 and 79 made of conductive materials such as Mo or MoW, Cr, Al or Al alloy and Ta is formed on the ohmic contact layer pattern 55, 56 and 58. The data wire has a data line part including a data line 72 extending in the vertical direction, a data pad 74 connected to an end of data line 72 and transmitting an image signal from an external circuit to the data line 72 and a source electrode 75 of a thin film transistor (TFT), which is a branch of data line 72. The data wire also has a drain electrode 76 of the TFT located opposite to the source electrode 75 with respect to the gate electrode 26 and separated from the data line part 72, 74 75, a pixel electrode line 79 connected to the drain electrode 76 and parallel the common electrodes line 27, and a pixel electrode 78 connected to the pixel electrode line 79 and parallel with the common electrode 28. The common electrodes 28 and the pixel electrode 78 are alternately located to apply electrode fields nearly parallel to the substrate 10. Storage capacitors may be formed on the portion where the pixel electrode line 79 and the common electrode line 27 overlap each other.

The data wire 72, 74, 75, 76, 77, 78 and 79 may have a multiple-layered structure like the gate wire 22, 24 and 26, and common wire 27 and 28. Of course, when the data wire has a multiple-layered structure, it is preferable that one layer is made of a material having a low resistivity and another is made of a material having a good contact with other materials.

The ohmic contact layer pattern 54, 55, 56 and 59 plays a role to reduce the contact resistance between the semiconductor layer pattern 42, 44 and 48 and the data wire 72, 74, 75, 76, 77, 78 and 79 thereon, is only formed therebetween.

The data wire 72, 74, 75, 76, 77, 78 and 79 and the semiconductor layer pattern 42, 44 and 48 are covered with a passivation layer 80 having contact holes 82 and 83 exposing the gate pad 24 and the data pad 74 respectively. The passivation layer 80 plays a role to protect the channel of the semiconductor 42 between the source electrode 75 and the drain electrode 76 at least. The passivation layer 80 may be made of an insulating material such as SiNx or acrylic organic material.

Now, a manufacturing method of a thin film transistor array panel according to an embodiment of the present invention will be described with reference to the FIGS. 23A to 25C and FIGS. 20 to 22 mentioned above.

Figure 23A:
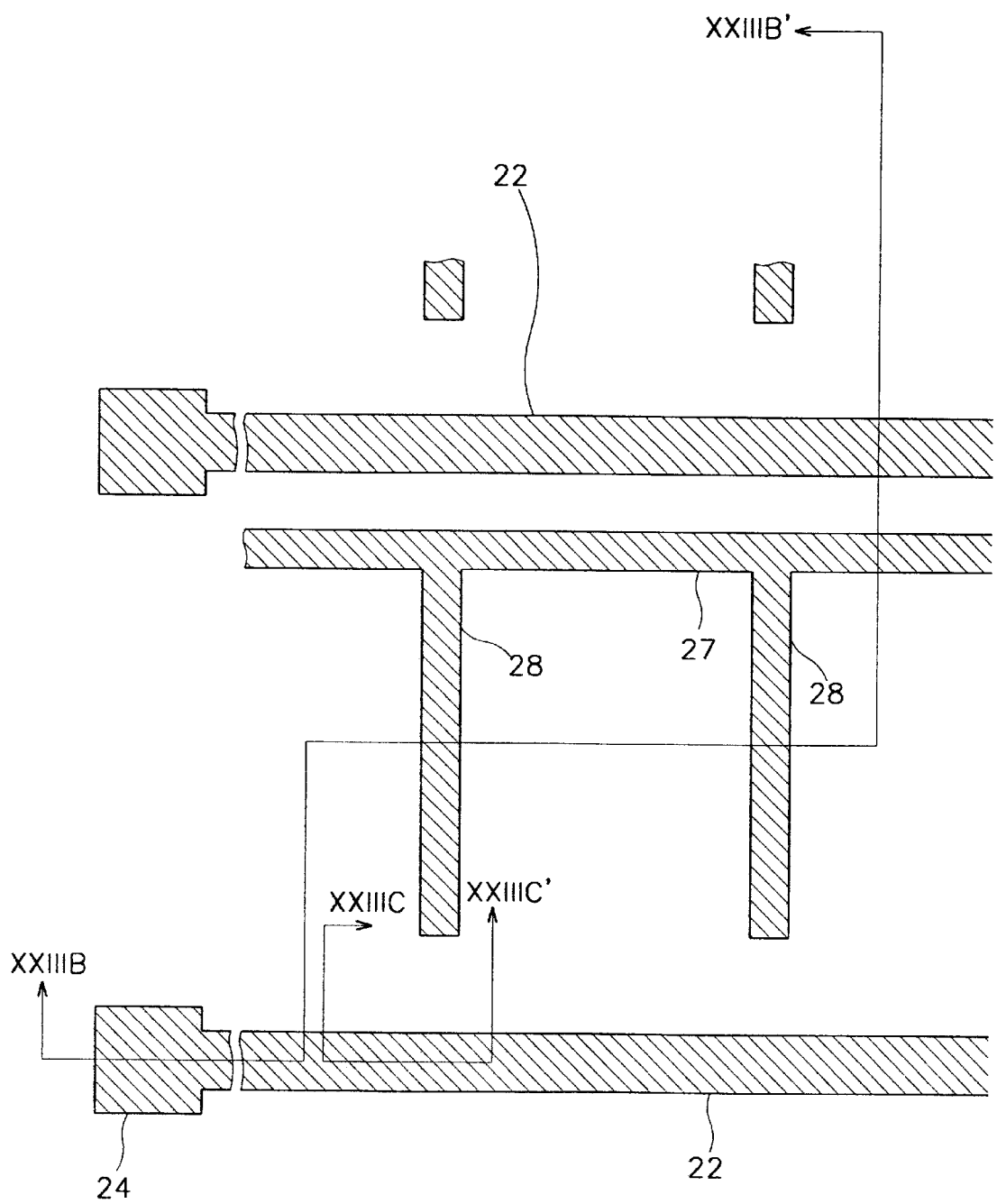
FIG. 23A is a layout view of a TFT array panel in the first manufacturing step according to the third embodiment of the present invention.
Figure 23B:
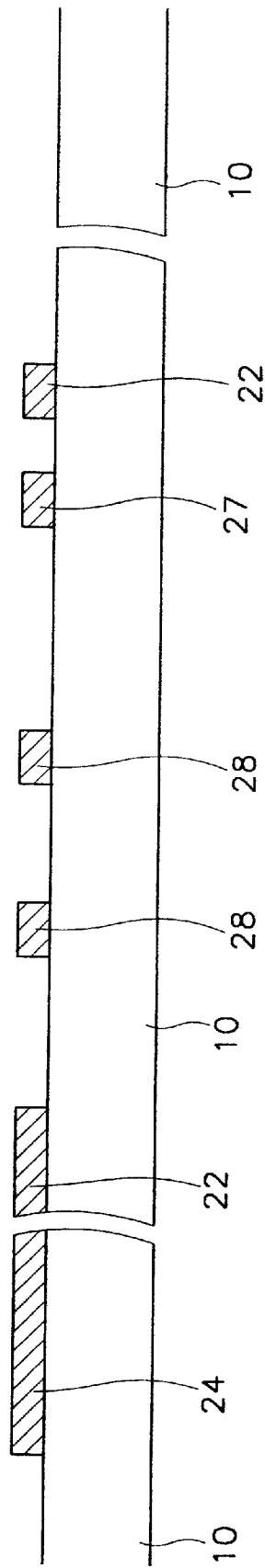
FIGS. 23B and 23C are respectively the cross-sectional views taken along the line XXIIIB–XXIIIB' and XII-IC–XIIIC' of the FIG. 23A.
Figure 23C:
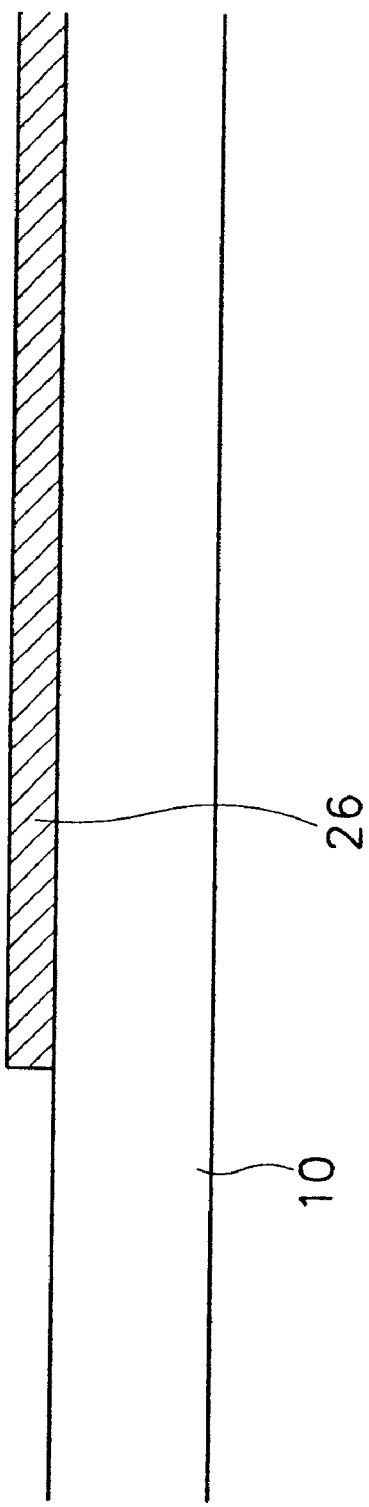

At first, as shown in FIGS. 23A to 23C, a layer of conductor such as a metal is deposited on a substrate 10 by such as sputtering to a thickness 1,000 Å to 3,000 Å. A gate wire including a gate line 22, a gate pad 24 and a gate electrode 26, and a common wire including a common electrode line 27, a common pad (not shown) and common electrodes 28 are formed by dry or wet etch using the first mask.

Figure 24A:
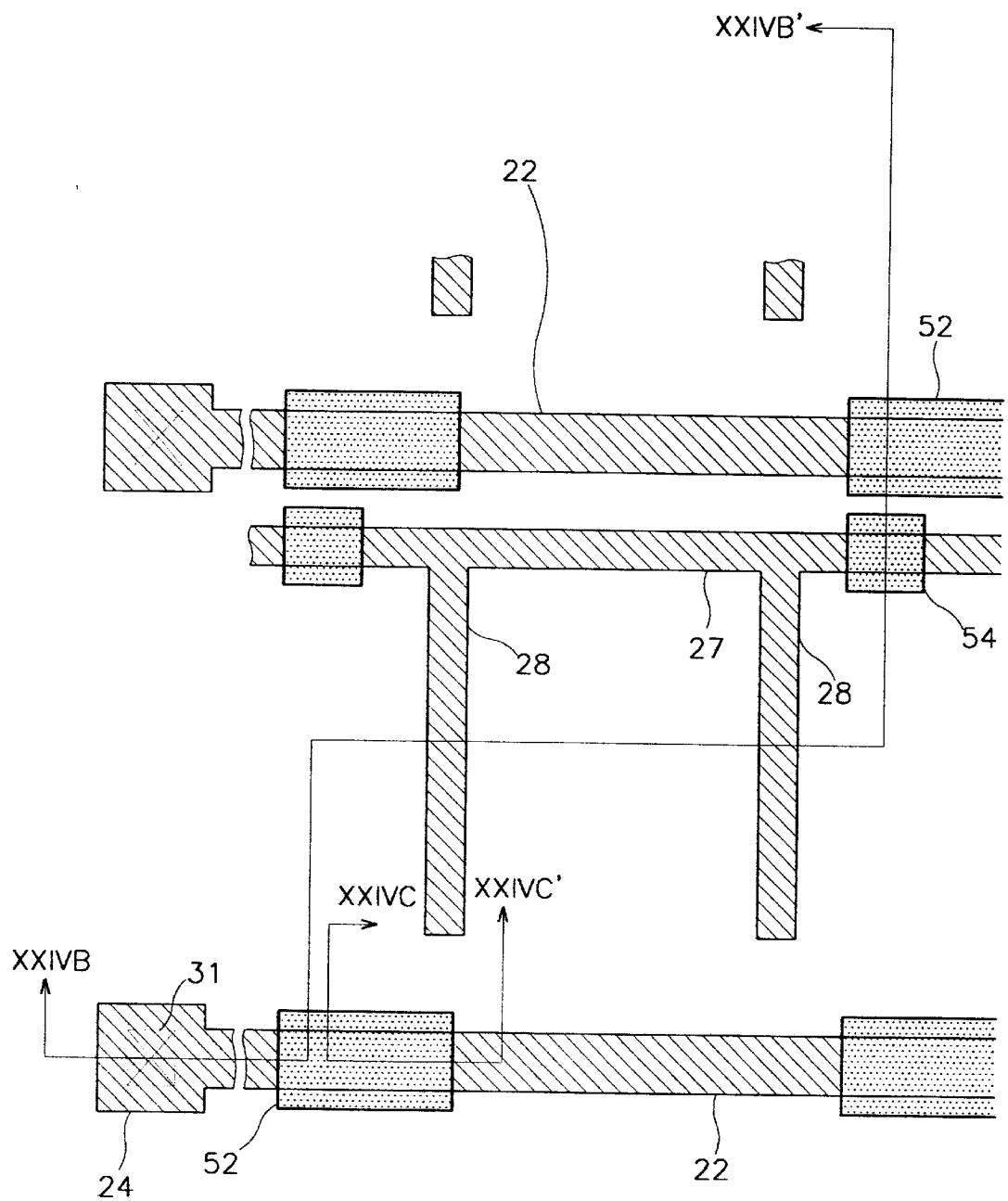
FIG. 24A is a layout view of a TFT array panel in a manufacturing step following the FIGS. 23A to 23C.
Figure 24B:
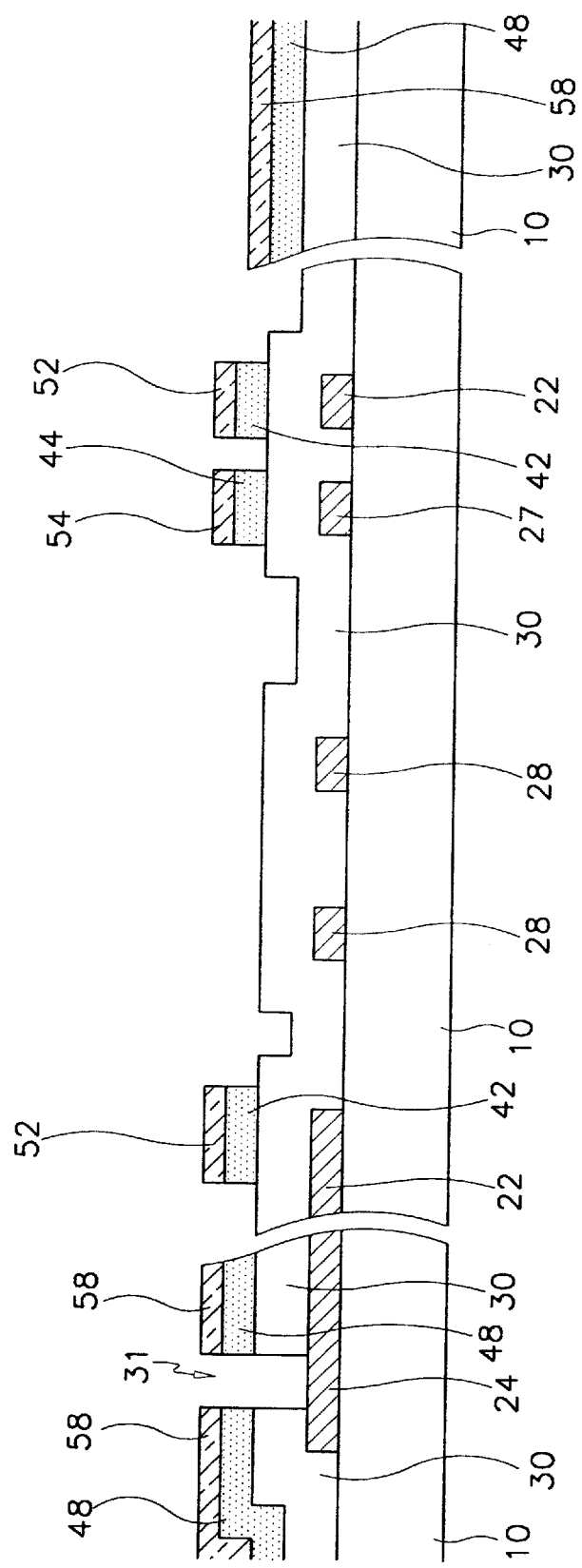
FIGS. 24B and 24C are respectively the cross-sectional views taken along the line XXIVB–XXIVB' and XXIVC–XXIVC' of the FIG. 24A.
Figure 24C:
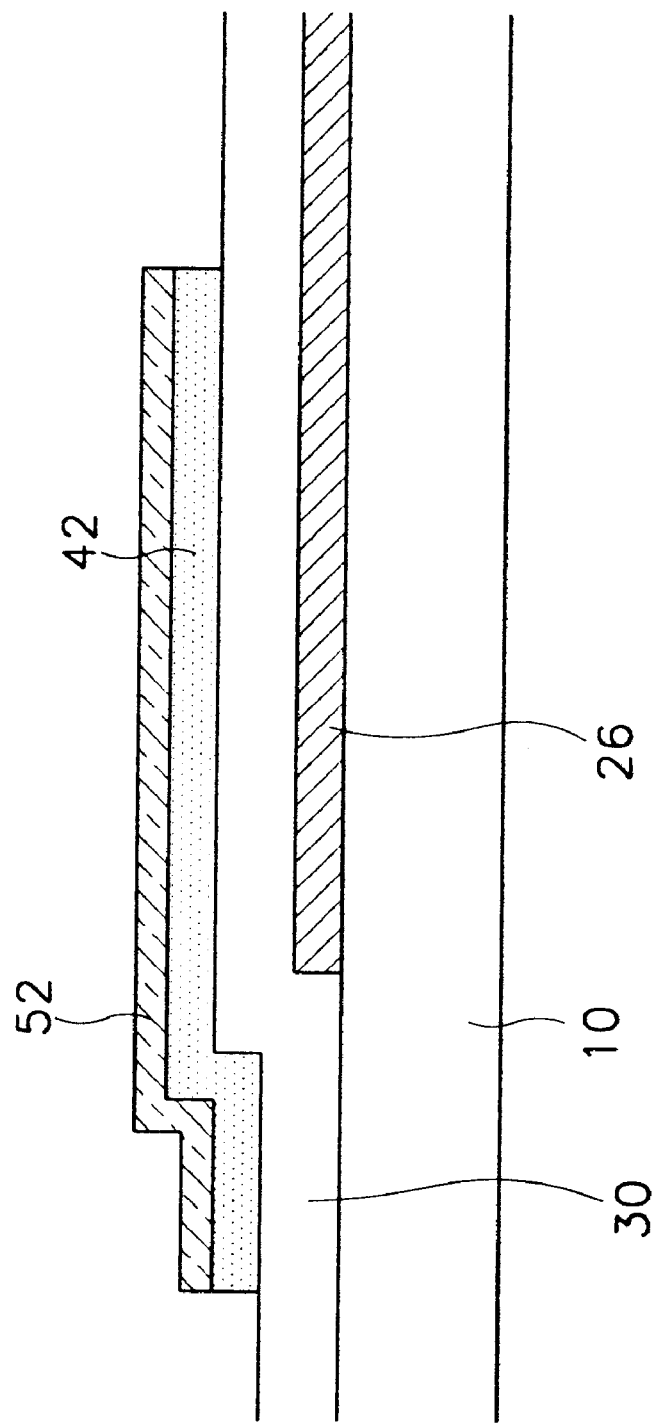
Figure 25A:
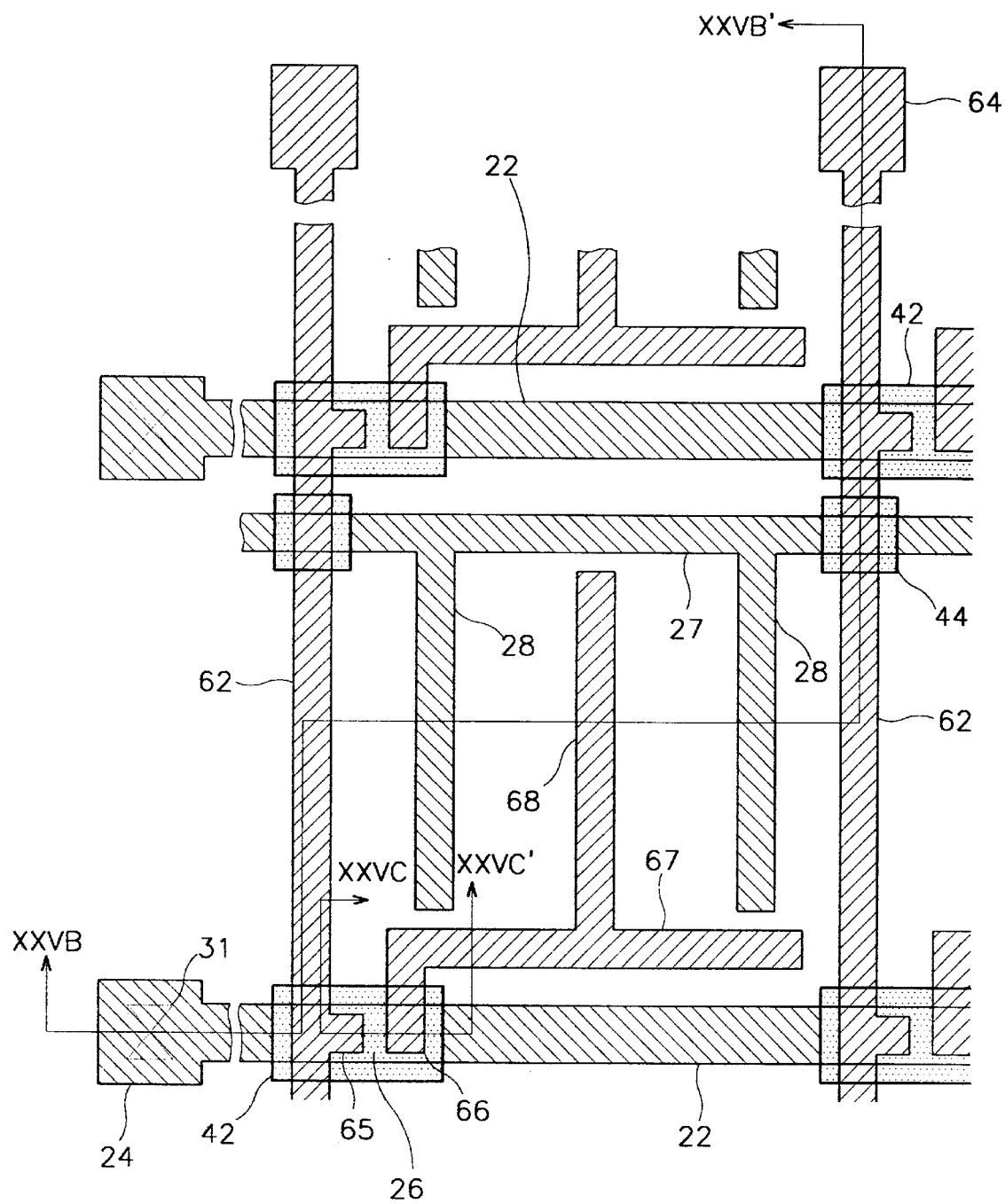
FIG. 25A is a layout view of a TFT array panel in a manufacturing step following the FIGS. 24A to 24C.
Figure 25B:
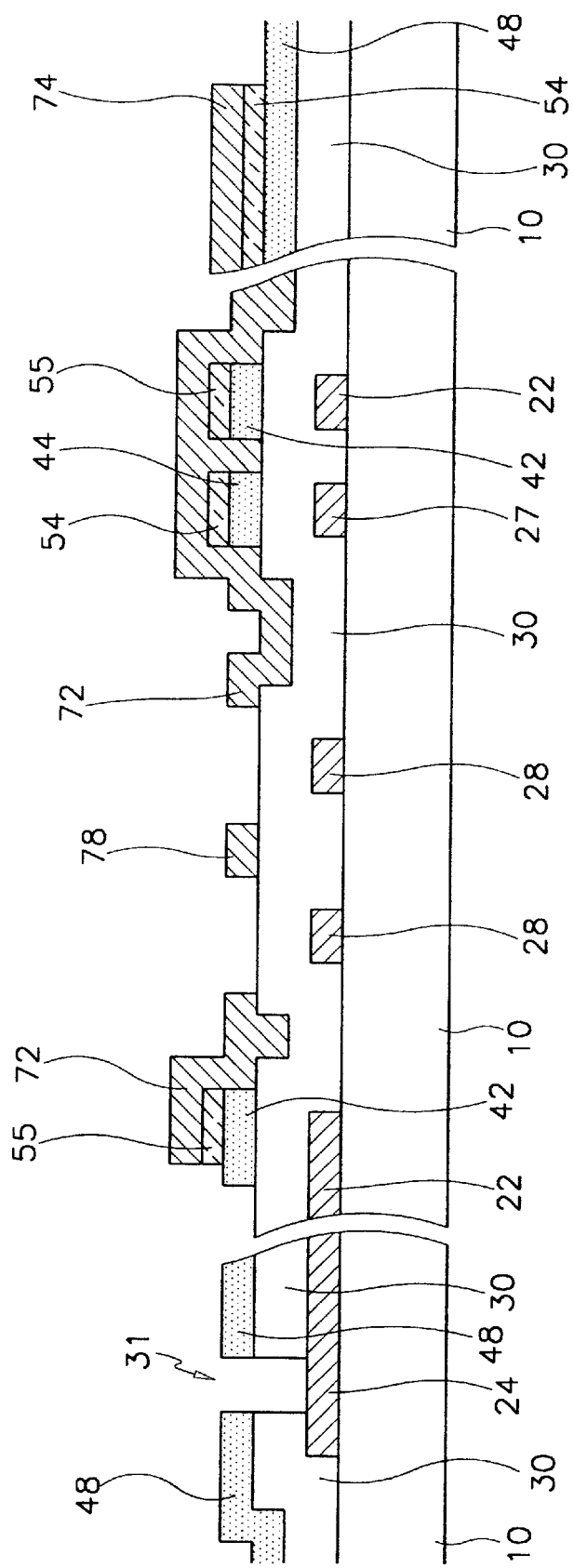

Next, as shown in FIGS. 24A to 24C, a gate insulating layer 30, a semiconductor layer 40 and a doped amorphous silicon layer 50 as an ohmic contact layer are sequentially deposited to have the thickness of 1,500 Å to 5,000 Å, 500 Å to 1,500 Å and 300 Å to 600 Å respectively by such as chemical vapor deposition (CVD). Then, the ohmic contact layer 50, the semiconductor layer 40, the gate insulating layer 30 are patterned at a time by using the second mask to form a semiconductor layer pattern 42, 44 and 48, an ohmic contact layer pattern 52, 54 and 58, and contact hole 31. At this time, the ohmic contact layer 50, the semiconductor layer 40 and the gate insulating layer 30 on the gate pad 24 are removed in the peripheral area P. However, only some parts of the ohmic contact layer 50 and the semiconductor layer 40 should be removed to form the semiconductor layer pattern 42, 44 and 48, the ohmic contact layer pattern 52, 54 and 58, and the gate insulating layer 30.

For this purpose, a PR pattern is formed to have thickness that varies depending on the position, and the layers under the PR pattern are dry etched by using the PR pattern as an etch mask, as described in the third embodiment. A photomask having a various transmittance of light according to the position is used to form the PR pattern.

A conductor layer of such as a metal are deposited to have the thickness of 1,500 Å to 3,000 Å by such as the sputtering. The conductor layer and the ohmic contact layer pattern 52, 54 and 58 thereunder are patterned to form a data wire 72, 74, 75, 76, 77, 78 and 79, and an ohmic contact layer pattern 54, 55, 56 and 59 shown in FIGS. 25A to 25C by using the third mask.

Next, as shown in FIGS. 20 to 22, a passivation layer 80 is formed to have a thickness over 3,000 Å by CVD of SiNx or spin coating of organic insulator. Then, the passivation layer 80 are patterned by using the fourth mask to expose the gate pad 24, the common signal pad and the data pad 74 to form contact holes 82 and 83 and to complete the TFT array panel.

Of course, even in the first embodiment if the third photomask having a varying transmittance of light according to the position is used, the gate insulating layer 30 can be left except for the contact hole 31 exposing the gate pad 24, and only the semiconductor layer pattern 42 of TFT are formed.

In the present embodiment, the contact hole 31 exposing the gate pad 24 is formed with the semiconductor layer pattern 42, 44 and 48, and the ohmic contact pattern 52, 54 and 58 by using one photomask, reducing the number of photomasks.

According to the present invention, the manufacturing method may be simplified by reducing the manufacturing steps. Thereby, the manufacturing cost is reduced and the yield is improved. Further more, it is possible to etch a layer to have variant thickness depending on the location at the same time with an even thickness for that location.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A method for manufacturing a thin film transistor array panel for a liquid crystal display comprising the steps:

forming a gate wire on an insulating substrate by using a first photolithography process;

forming a layer pattern including a gate insulating layer pattern, a semiconductor layer pattern and an ohmic contact layer pattern on the gate wire by using a second photolithography process, the step of forming the layer pattern including only one photolithography process;

forming a conductor pattern having a dual-layered structure including of a lower conductor layer and an upper conductor layer by using a third photolithography process;

removing a portion of the ohmic contact layer pattern which is not covered with the conductor pattern;

forming a passivation layer by using a fourth photolithography process; and removing a portion of the upper conductor layer of the conductor pattern which is not covered with the passivation layer.

2. The method of claim 1, wherein the ohmic contact layer pattern is made of silicide.

3. The method of claim 1, wherein the ohmic contact layer pattern is made of microcrystallized silicon.

4. The method of claim 1, wherein the gate insulating layer pattern, the semiconductor layer pattern and the ohmic contact layer pattern are formed to have the same shapes in the step of forming the layer pattern.

5. The method of claim 4, wherein the step of forming the layer pattern comprises the steps of:

depositing a gate insulating layer and a semiconductor layer sequentially;

depositing a silicifiable metal layer on the semiconductor layer to form an ohmic contact layer of silicide;

removing the metal layer; and patterning the ohmic contact layer, the semiconductor layer and the gate insulating layer by using the second photolithography process to form the ohmic contact layer pattern, the semiconductor layer pattern and the gate insulating layer pattern.

6. The method of claim 4, wherein the step of forming the layer pattern comprises the step of:

depositing a gate insulating layer and a semiconductor layer sequentially, patterning the semiconductor layer and the gate insulating layer by using the second photolithography process to form the semiconductor layer pattern and the gate insulating layer pattern, depositing a silicifiable metal layer on the semiconductor layer pattern to form the ohmic contact layer pattern of silicide; and removing the metal layer.

7. The method of claim 6, wherein the gate wire includes a lower layer and an upper layer thereon.

8. The method of claim 7, wherein the lower layer of the gate wire is made of aluminum or aluminum alloy, the upper layer of the gate wire is made of molybdenum or molybdenum alloy, and the metal layer is made of chromium.

9. The method of claim 7, wherein the lower layer of the gate wire is made of chromium, the upper payer of the gate wire is made of aluminum or aluminum alloy, and the metal layer is made of molybdenum or molybdenum alloy.

10. The method of claim 4, wherein the step of forming the layer pattern comprises the step of:

depositing a gate insulating layer and a semiconductor layer of amorphous silicon sequentially;

depositing a doped amorphous silicon layer on the semiconductor layer to form an ohmic contact layer;

microcrystalizing the ohmic contact layer; and patterning the ohmic contact layer, the semiconductor layer and the gate insulating layer by using the second photolithography process to form the ohmic contact layer pattern, the semiconductor layer pattern and the gate insulating layer pattern.

11. The method of claim 1, wherein the layer pattern is formed such that at least one of the gate insulating layer pattern, the semiconductor layer pattern and the ohmic contact layer pattern has a shape different from the others in the step of forming the layer pattern.

12. The method of claim 11, wherein the step of forming the layer pattern comprises the steps of:

depositing a gate insulating layer, a semiconductor layer and an ohmic contact layer sequentially;

coating a photoresist layer on the ohmic contact layer;

developing the photoresist layer to form a photoresist pattern having a first portion, a second portion thicker than the first portion and a third portion thicker than the second portion; and etching the portions of the ohmic contact layer, the semiconductor layer and the gate insulating layer under the first portion and portions of the ohmic contact layer and the semiconductor layer under the second portion to form the ohmic contact layer pattern, the semiconductor layer pattern, and the gate insulating layer pattern.

13. The method of claim 12, wherein the photoresist pattern is formed by using a photomask including at least a first region, a second region and a third region that correspond to the first portion, the second portion and the third portion, respectively, and have different levels of transmittance.

14. The method of claim 13, wherein the photoresist pattern is made of a positive photoresist, and the transmittance of the second region is smaller than the transmittance of the first region and is larger than the transmittance of the third region.

15. The method of claim 14, wherein the photomask includes a mask substrate and at least a mask layer on the mask substrate, and the difference of the transmittance between the second region and the third region is obtained by forming portions of the mask layer in the second and the third regions having the different transmittance.

16. The method of claim 14, wherein the photomask includes a mask substrate and at least a mask layer on the mask substrate, and the difference of the transmittance between the second region and the third region is obtained by differentiating the thickness of the portions of the mask layer in the second and the third regions.

17. The method of claim 14, wherein the photomask has a slit or a grid pattern that are smaller than the resolution of an exposure equipment.

18. The method of claim 14, wherein the photomask includes at least two pieces having at least two among the first to the third region.

19. The method of claim 1, wherein the lower conductor layer is made of transparent conductive material.

20. The method of claim 1, wherein the gate wire includes a plurality of gate lines, a plurality of gate electrodes that are branches of the gate lines and a plurality of gate pads that are connected to the gate lines and transmit scanning signals from an external circuit to the gate lines, the conductor pattern includes a data wire and a plurality of pixel electrodes, and the layer pattern and the passivation layer have a plurality of contact holes and a plurality of first openings, respectively, for electrically connecting the gate pad to the external circuit.

21. The method of claim 20, wherein the conductor pattern further includes a plurality of redundant gate pads connected to the gate pads through the contact holes, and the lower conductor layer of the redundant gate pads is exposed through the first openings.

22. The method of claim 21, wherein the ohmic contact layer pattern has a plurality of two separate portions, the data wire includes a plurality of data lines intersecting the gate lines, a plurality of source electrodes that are connected to the data lines and formed on the one portions of the ohmic contact layer pattern, a plurality of drain electrodes that are formed on the other portions of the ohmic contact layer pattern located opposite to the source electrodes with respect to the gate electrodes and separated from the source electrodes, and a plurality of data pads that are connected to the data lines and transmit image signals from an external circuit to the data lines, the pixel electrodes are connected to the drain electrodes, and the passivation layer has a plurality of second openings exposing the lower conductor layer of the pixel electrodes and a plurality of third openings exposing the lower conductor layer of the data pads.

23. The method of claim 22, wherein the passivation layer has a plurality of fourth openings exposing portions of the gate insulating layer pattern on the gate line between the adjacent data lines, and further comprising the step of removing a portion of the semiconductor layer pattern that is not covered with the passivation layer.

24. The method of claim 23, wherein the pixel electrodes overlap the gate lines neighboring the pixel electrodes, and a portion of the semiconductor layer pattern interposed between the pixel electrodes and the gate lines is isolated.

25. A method for manufacturing a thin film transistor array panel for a liquid crystal display comprising the steps of:

forming a gate wire including a gate line, a gate electrode and gate pad on an insulating substrate by a first photolithography process;

depositing a gate insulating layer, a semiconductor layer and an ohmic contact layer on the gate wire sequentially;

patterning the semiconductor layer and the ohmic contact layer along with the gate insulating layer by a second photolithography process to form a gate insulating layer pattern having a contact hole exposing the gate pad, a semiconductor layer pattern and an ohmic contact layer pattern, the step of patterning the semiconductor layer and the ohmic contact layer pattern along with the gate insulating layer including only one photolithography process;

forming a conductor layer having a dual-layered structure including a lower conductor layer and an upper conductor layer;

patterning the conductor layer by a third photolithography process to form a data wire including a data line, a source electrode, a drain electrode and a data pad, a pixel electrode connected to the drain electrode, and a redundant gate pad connected to the gate pad through the contact hole;

etching a portion of the ohmic contact layer pattern which is not covered with the data wire, the pixel electrode and the redundant gate pad;

depositing a passivation layer on the substrate;

etching the passivation layer by a fourth photolithography process to form a passivation layer pattern having a first to a third opening exposing the redundant gate pad, the data pad and the pixel electrode, respectively; and etching a portion of the upper conductor layer which is not covered with the passivation layer.

26. The method of claim 25, wherein an edge of the pixel electrode is exposed through the third opening, and further comprises the step of removing a portion of the gate insulating layer near the edge of the pixel electrode.

27. The method of claim 25, wherein the ohmic contact layer is made of silicide, microcrystallized silicon or doped amorphous silicon.

28. The method of claim 25, wherein the gate insulating layer pattern, the semiconductor layer pattern and the ohmic contact layer pattern are formed to have different shapes in the step of forming the layer pattern.

29. The method of claim 28, wherein the step of patterning the semiconductor layer and the ohmic contact layer pattern along with the gate insulating layer comprises the steps of:

coating a photoresist layer on the ohmic contact layer;

developing the photoresist layer to form a photoresist pattern having a first portion, a second portion thicker than the first portion and a third portion thicker than the second portion; and etching portions of the ohmic contact layer, the semiconductor layer and the gate insulating layer under the first portion and portions of the ohmic contact layer and the semiconductor layer under the second portion to form the ohmic contact layer pattern, the semiconductor layer pattern, and the gate insulating layer pattern.

30. The method of claim 29, wherein the photoresist pattern is formed by a photomask including at least a first region, a second region and a third region that correspond to the first portion, the second portion and the third portion, respectively, and have different levels of transmittance.

31. The method of claim 30, wherein the photomask includes a mask substrate and at least a mask layer on the mask substrate, and the difference of the transmittance between the second region and the third region is obtained by forming portions of the mask layer in the second and the third regions having the different transmittance.

32. The method of claim 30, wherein the photomask includes a mask substrate and at least a mask layer on the mask substrate, and the difference of the transmittance between the second region and the third region is obtained by differentiating the thickness of portions of the mask layer in the second and the third regions.

33. The method of claim 30, wherein the photomask has a slit or a grid pattern that are smaller than the resolution of exposure equipment.

34. The method of claim 30, wherein the photomask includes at least two pieces having at least two among the first to the third region.

35. The method of claim 29, wherein the first and the third portion are located over the contact hole and the semiconductor layer pattern, respectively.

36. The method of claim 28, wherein the step of patterning the semiconductor layer and the ohmic contact layer pattern along with the gate insulating layer comprises the steps of:
coating a photoresist layer on the ohmic contact layer;
developing the photoresist layer to form a photoresist layer pattern having a first portion, a second portion thicker than the first portion, and a third portion thicker than the second portion;
etching portions of the ohmic contact layer, the semiconductor layer and the gate insulating layer under the first portion; and
removing the photoresist pattern of the second portion by ashing, and
etching the ohmic contact layer and the semiconductor layer by using the photoresist pattern of the third portion as etch mask.

37. A method for manufacturing a thin film transistor array panel for a liquid crystal display, comprising the steps of:
forming a gate wire including a gate line, a gate electrode and a gate pad on an insulating substrate;
forming a gate insulating layer pattern on the gate wire;
forming a semiconductor layer pattern on the gate insulating layer pattern;
forming an ohmic contact layer pattern on the semiconductor layer pattern;
forming a data wire including a data line, a source electrode, a drain electrode and a data pad;
forming a passivation layer; and
forming a pixel electrode connected to the drain electrode,
wherein the gate insulating layer pattern is formed along with at least one of the semiconductor pattern and the ohmic contact layer pattern through a single photolithography process using a photoresist pattern having more than two different thickness that varies depending on a position.

38. The method of claim 37, wherein the photoresist pattern has a first portion, a second portion that is thicker than the first portion and a third portion that is thicker than the first portion but thinner then the second portion.

39. The method of claim 38, wherein the photoresist pattern is formed by using a photomask including at least a first, a second region and a third region that correspond to the first portion, the second portion and the third portion, respectively, and have different levels of transmittance.

40. The method of claim 39, wherein the photoresist pattern is made of a positive photoresist layer, and
the transmittance of the third region is smaller than the transmittance of the first region and is larger than the transmittance of the second region.

41. The method of claim 39, wherein the photomask includes a mask substrate and at least a mask layer on the mask substrate, and the difference of the transmittance between the second region and the third region is obtained by forming portions of the mask layer in the second and the third regions having different levels of transmittance.

42. The method of claim 40, wherein the photomask includes a mask substrate and at least a mask layer on the mask substrate, and the difference of the transmittance between the second region and the third region is obtained by differentiating the thickness of portions of the mask layer in the second region and the third region.

43. The method of claim 40, wherein the photomask has a slit or a grid pattern that is smaller than the resolution of exposure equipment.

44. A method for manufacturing a thin film transistor array panel for a liquid crystal display, comprising the steps of:
forming a gate wire including a gate line, a gate electrode and a gate pad, and a common wire including a common signal line and a common electrode on an insulating substrate;
depositing sequentially a gate insulating layer, a semiconductor layer and an ohmic contact layer on the gate wire and the common wire;
coating a photoresist layer on the ohmic contact layer;
developing the photoresist layer to form a photoresist pattern having more than two different thickness depending on the portion;
patterning the semiconductor layer and the ohmic contact layer by using the photoresist pattern to form a semiconductor layer pattern, a first ohmic contact layer pattern and a contact hole exposing the gate pad;
depositing a conductor layer;
patterning the conductor layer and the first ohmic contact layer pattern to form a data wire including a data line, a source electrode, a drain electrode, a data pad and a pixel electrode, and a second ohmic contact layer pattern under the data wire;
depositing a passivation layer; and
etching the passivation layer to expose the gate pad and the data pad.

45. A method for manufacturing a thin film transistor array panel for a liquid crystal display, comprising the steps of:
performing a first photolithography and etching process to form a gate wire on an insulating substrate;
performing a second photolithography and etching process to form a layer pattern including a gate insulating layer pattern, a semiconductor layer pattern and an ohmic contact layer pattern on the gate wire;
performing a third photolithography and etching process to form a conductor pattern having a dual-layered structure including of a lower conductor layer and an upper conductor layer;
removing a portion of the ohmic contact layer pattern that is not covered with the conductor pattern;
performing a fourth photolithography and etching process to form a passivation layer; and
removing a portion of the upper conductor layer of the conductor pattern that is not covered with the passivation layer.

46. A method for manufacturing a thin film transistor array panel for a liquid crystal display, comprising the steps of:
performing a first photolithography and etching process to form a gate wire including a gate line, a gate electrode and gate pad on an insulating substrate;

depositing a gate insulating layer, a semiconductor layer and an ohmic contact layer on the gate wire sequentially;

performing a second photolithography and etching process to pattern the semiconductor layer and the ohmic contact layer pattern along with the gate insulating layer to form a gate insulating layer pattern having a contact hole exposing the gate pad, a semiconductor layer pattern and an ohmic contact layer pattern;

forming a conductor layer having a dual-layered structure including a lower conductor layer and an upper conductor layer;

performing a third photolithography and etching process to pattern the conductor layer to form a data wire including a data line, a source electrode, a drain electrode and a data pad, a pixel electrode connected to the drain electrode, and a redundant gate pad connected to the gate pad through the contact hole;

etching a portion of the ohmic contact layer pattern which is not covered with the data wire, the pixel electrode and the redundant gate pad;

depositing a passivation layer on the substrate;

performing a fourth photolithography and etching process to etch the passivation layer to form a passivation layer pattern having a first to a third opening exposing the redundant gate pad, the data pad and the pixel electrode, respectively; and etching a portion of the upper conductor layer which is not covered with the passivation layer.

\* \* \* \* \*